United States Patent

Yokoi

(10) Patent No.: US 8,185,305 B2
(45) Date of Patent: May 22, 2012

(54) REWRITE APPARATUS

(75) Inventor: Shinichi Yokoi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 769 days.

(21) Appl. No.: 12/314,344

(22) Filed: Dec. 9, 2008

(65) Prior Publication Data

US 2009/0150072 A1 Jun. 11, 2009

(30) Foreign Application Priority Data

Dec. 10, 2007 (JP) ................................. 2007-318433

(51) Int. Cl.
*G01C 21/32* (2006.01)

(52) U.S. Cl. ........ 701/430; 701/409; 701/450; 701/461; 340/995.14; 340/995.18; 711/106

(58) Field of Classification Search .................... 701/35, 701/208, 209, 430, 409, 450, 461; 340/995.1, 340/995.19, 995.14, 995.18; 711/103, 106; 365/185.33

See application file for complete search history.

(56) References Cited

U.S. PATENT DOCUMENTS

| | | | | |
|---|---|---|---|---|
| 5,136,862 A * | 8/1992 | Langen | ............................. | 70/14 |
| 5,187,665 A * | 2/1993 | Futami et al. | .................... | 701/49 |
| 5,365,486 A * | 11/1994 | Schreck | .................... | 365/185.22 |
| 5,625,791 A * | 4/1997 | Farrugia et al. | ............... | 711/106 |
| 5,699,297 A * | 12/1997 | Yamazaki et al. | ........ | 365/185.25 |
| 6,009,363 A * | 12/1999 | Beckert et al. | ................... | 701/33 |
| 6,044,014 A * | 3/2000 | Komori et al. | ........... | 365/185.04 |
| 6,345,230 B1 * | 2/2002 | Hiyokawa et al. | ............. | 701/209 |
| 6,501,699 B2 | 12/2002 | Mizugaki | | |
| 6,931,480 B2 * | 8/2005 | Swaminathan | ............... | 711/103 |
| 6,957,136 B2 * | 10/2005 | Tachibana et al. | ............... | 701/35 |
| 6,957,296 B2 * | 10/2005 | Terada et al. | .................. | 711/103 |
| 7,054,728 B2 * | 5/2006 | Kouda et al. | ..................... | 701/35 |
| 7,363,129 B1 * | 4/2008 | Barnicle et al. | .................. | 701/29 |
| 2002/0029313 A1 * | 3/2002 | Funakoshi | ..................... | 711/102 |
| 2002/0069319 A1 * | 6/2002 | Lee et al. | ...................... | 711/106 |
| 2006/0195708 A1 | 8/2006 | Kato et al. | | |
| 2006/0259207 A1 * | 11/2006 | Natsume | .......................... | 701/1 |
| 2007/0005204 A1 * | 1/2007 | Yamamoto et al. | ............. | 701/35 |

FOREIGN PATENT DOCUMENTS

JP A-06-110793 4/1994

(Continued)

OTHER PUBLICATIONS

Machine Translation of JP H08-153397.*
Office Action mailed Apr. 19, 2010 from the Japan Patent Office in the corresponding Japanese patent application No. 2007-318433 (English translation enclosed).

(Continued)

*Primary Examiner* — Darnell Jayne
*Assistant Examiner* — Sasha T Varghese
(74) *Attorney, Agent, or Firm* — Posz Law Group, PLC

(57) ABSTRACT

A rewrite apparatus calculates a risk of destruction of data due to data retention in each file. It is determined whether a refresh start condition is satisfied. The refresh start condition is provided in accordance with the calculated risk. When the refresh start condition is satisfied, it is determined that the possibility to completely execute the refresh is high. The refresh is thereby executed. The rewrite apparatus can thus reduce the possibility to interrupt the refresh of the data stored in the storage medium such as a flash memory.

20 Claims, 14 Drawing Sheets

FOREIGN PATENT DOCUMENTS

| | | |
|---|---|---|
| JP | A-08-147988 | 6/1996 |
| JP | A-08-153397 | 6/1996 |
| JP | A-09-160835 | 6/1997 |
| JP | A-11-195293 | 7/1999 |
| JP | A-2000-11295 | 1/2000 |
| JP | A-2000-11670 | 1/2000 |
| JP | A-2002-049624 | 2/2002 |

OTHER PUBLICATIONS

Office Action mailed Oct. 14, 2010 from the Japan Patent Office in the corresponding Japanese patent application No. 2007-318433 (English translation enclosed).

* cited by examiner

WHEN UPDATING

WHEN NOT UPDATING

START OF DRIVE

END OF DRIVE

FIG. 4

REWRITE MANAGEMENT

| ID | FILE NAME | NO. OF UPDATES | DATE | RISK | | | | ADDRESS | FILE SIZE |
| --- | --- | --- | --- | --- | --- | --- | --- | --- | --- |
| | | | | Lv1 | Lv2 | Lv3 | Lv4 | | |
| 1 | MAP DATA A | xxx | X/X/X | X/X/X | X/X/X | X/X/X | X/X/X | XX | XX |
| ⋮ | ⋮ | ⋮ | ⋮ | ⋮ | ⋮ | ⋮ | ⋮ | ⋮ | ⋮ |
| I | MAP DATA B | xxx | X/X/X | X/X/X | X/X/X | X/X/X | – | XX | XX |
| J | FACILITY RETRIEVAL DATA C | xxx | X/X/X | X/X/X | – | – | – | XX | XX |
| ⋮ | ⋮ | ⋮ | ⋮ | ⋮ | ⋮ | ⋮ | ⋮ | ⋮ | ⋮ |
| K | FACILITY RETRIEVAL DATA D | xxx | X/X/X | X/X/X | X/X/X | X/X/X | – | XX | XX |
| L | PROGRAM E | xxx | X/X/X | X/X/X | – | – | – | XX | XX |
| ⋮ | ⋮ | ⋮ | ⋮ | ⋮ | ⋮ | ⋮ | ⋮ | ⋮ | ⋮ |
| M | PROGRAM F | xxx | X/X/X | – | – | – | – | XX | XX |

REFRESH START CONDITION

| ID | FILE NAME | RISK | | |
|---|---|---|---|---|
| | | Lv1 | Lv2 | Lv3 |
| 1 | MAP DATA A | XXX | XXX | XXX |
| ... | ... | ... | ... | ... |
| I | MAP DATA B | XXX | XXX | XXX |
| J | FACILITY RETRIEVAL DATA C | XXX | XXX | XXX |
| ... | ... | ... | ... | ... |
| K | FACILITY RETRIEVAL DATA D | XXX | XXX | XXX |
| L | PROGRAM E | XXX | XXX | XXX |
| ... | ... | ... | ... | ... |
| M | PROGRAM F | XXX | XXX | XXX |

FIG. 14

REWRITE MANAGEMENT

| ID | FILE NAME | NO. OF UPDATES | NO. OF READS | RISK | | | | ADDRESS | FILE SIZE |
| | | | | Lv1 | Lv2 | Lv3 | Lv4 | | |
|---|---|---|---|---|---|---|---|---|---|
| 1 | MAP DATA A | xxx | xxx | x/x/x | x/x/x | x/x/x | x/x/x | xx | xx |
| ⋮ | ⋮ | ⋮ | ⋮ | ⋮ | ⋮ | ⋮ | ⋮ | | |
| I | MAP DATA B | xxx | xxx | x/x/x | x/x/x | x/x/x | – | xx | xx |
| J | FACILITY RETRIEVAL DATA C | xxx | xxx | x/x/x | – | – | – | xx | xx |
| ⋮ | ⋮ | ⋮ | ⋮ | ⋮ | ⋮ | ⋮ | ⋮ | | |
| K | FACILITY RETRIEVAL DATA D | xxx | xxx | x/x/x | x/x/x | x/x/x | – | xx | xx |
| L | PROGRAM E | xxx | xxx | x/x/x | – | – | – | xx | xx |
| ⋮ | ⋮ | ⋮ | ⋮ | ⋮ | ⋮ | ⋮ | ⋮ | | |
| M | PROGRAM F | xxx | xxx | – | – | – | – | xx | xx |

REWRITE APPARATUS

CROSS REFERENCE TO RELATED APPLICATION

This application is based on and incorporates herein by reference Japanese Patent Application No. 2007-318433 filed on Dec. 10, 2007.

FIELD OF THE INVENTION

The invention relates to a rewrite apparatus which executes a read and write of data from and into a storage medium including an electrically rewritable nonvolatile memory.

BACKGROUND OF THE INVENTION

Patent document 1: JP-H6-110793 A
Patent document 2: JP-2000-11670 A

High integration of flash memories, which are a kind of an electrically rewritable nonvolatile memory, is in progress in recent years. The flash memories are used as secondary storage devices or media such as memory cards, USB memories, and HDDs. Particularly, the memory cards are widely used as storage media of electronic devices, such as digital cameras and mobile phones. Some memory cards have storage capacity of several gigabytes.

However, the flash memories used for many applications have limited data retention periods (data retention problem). In NAND flash memories, which are suitable for larger capacity in comparison with, e.g., NOR flash memories, when data is read from a cell, data stored in the other memory cells sharing the same lead with the memory cell is gradually destroyed (read disturb problem, also called read retention problem).

For addressing such a problem, in general, the data area for ECC (Error Check and Correction) is provided, and the abnormalities of the data read from the flash memory are detected and corrected.

Patent document 1 discloses, as a countermeasure against the read disturb problem, the invention about a nonvolatile semiconductor storage device for counting the number of reads of data from blocks constituting a flash memory and for rewriting data in a block in which the number of reads of data reaches a predetermined number. The block is a unit constituting the area storing data in a flash memory, and is a minimum unit in which data can be deleted independently.

Patent document 2 discloses, as a countermeasure against the data retention problem, the invention about a device having a refresh circuit for measuring an elapsed time after writing data into a flash memory, and for rewriting data into the flash memory after a predetermined elapsed time.

However, the rewrite is interrupted when supply of the electric power to the devices of Patent documents 1 and 2 is stopped during the rewrite of the data into the flash memory. When the supply of the electric power is stopped, the data of the block to be rewritten may be destroyed. As mentioned above, the storage capacity of the flash memories is increasing, and the time required for the rewrite into the flash memory also is increasing, so that it is likely that the rewrite is interrupted. Some countermeasure against the above disadvantages is necessary.

SUMMARY OF THE INVENTION

For addressing the above disadvantages, an object of the present invention is to provide a rewrite apparatus for reducing the possibility to interrupt a rewrite into a storage medium such as a flash memory.

As an example of the present invention, a rewrite apparatus is provided as follows. The apparatus is for reading data stored in a storage medium and writing data into the storage medium, and for executing a refresh which reads data stored in a predetermined area of the storage medium and rewrites the read data in the predetermined area. The rewrite apparatus includes a storage device and a control device. The storage device is configured to store a refresh start condition under which the refresh is started in the predetermined area of the storage medium. The control device is configured to execute a start condition determination for determining whether the refresh start condition stored in the storage medium is satisfied, and for executing, when it is determined that the refresh start condition is satisfied, the refresh in the predetermined area corresponding to the satisfied refresh start condition. Herein, the refresh start condition stored in the storage device is satisfied when a possibility to execute the refresh completely is high.

BRIEF DESCRIPTION OF THE DRAWINGS

The above and other objects, features, and advantages of the present invention will become more apparent from the following detailed description made with reference to the accompanying drawings. In the drawings:

FIG. 4 is a diagram to show a rewrite management;

FIG. 14 is a diagram to show a refresh start condition;

DETAILED DESCRIPTION OF THE PREFERRED EMBODIMENTS

Hereafter, embodiments of this invention are explained using the appended drawings. Embodiments of the invention can take various forms within the technical scope of this invention without being limited to the following embodiments.

Explanation of Structure

Figure 1:
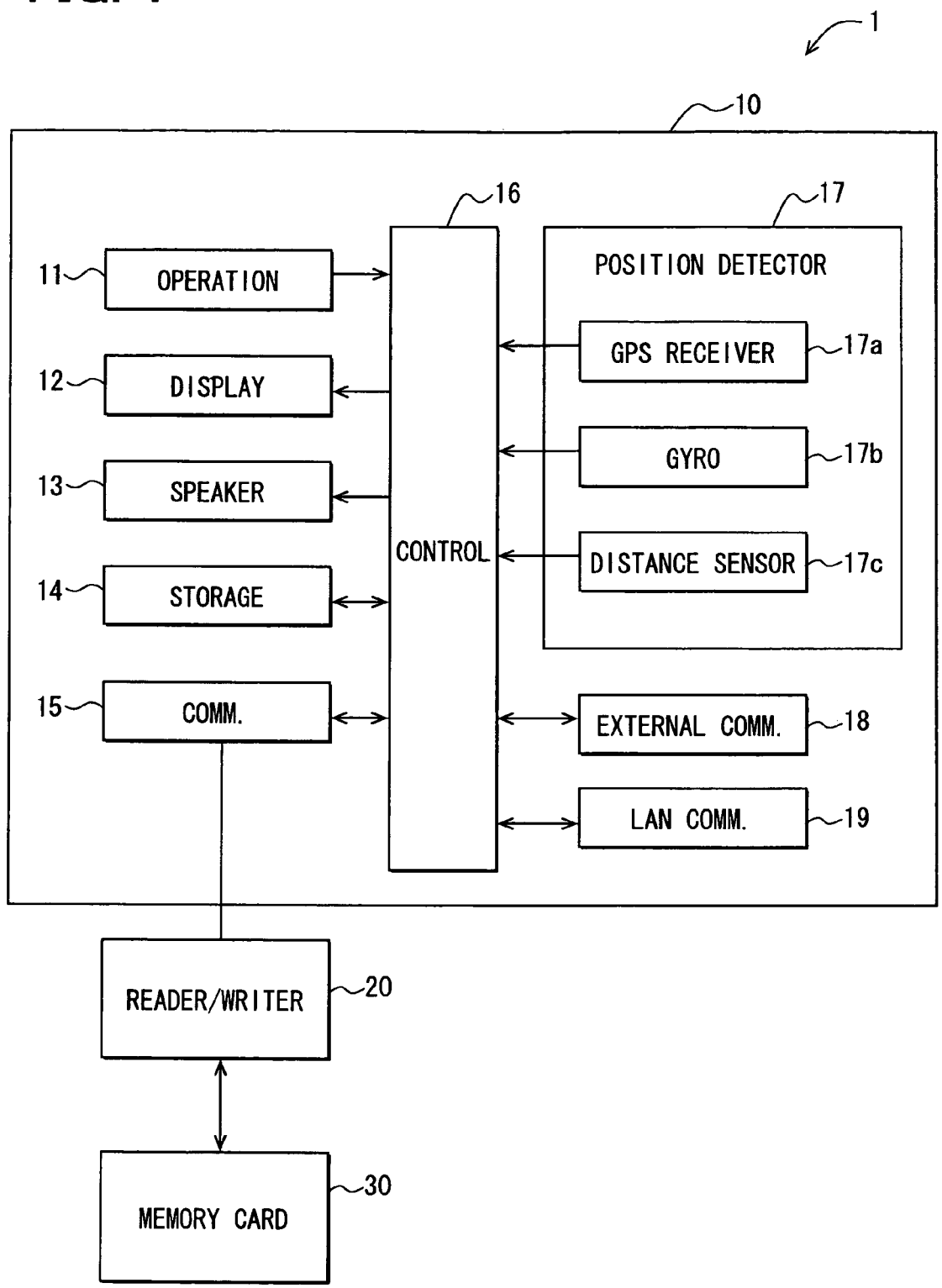
FIG. 1 is a block diagram showing a structure of an in-vehicle system and a navigation apparatus constituting the in-vehicle system.

A block diagram of FIG. 1 shows a structure of an in-vehicle system 1 explained in this embodiment. The in-vehicle system 1 includes a navigation apparatus 10, a memory card reader/writer 20, and a memory card 30. The navigation apparatus 10 and memory card reader/writer 20 are connected to one another by a bus. The memory card reader/writer 20 is connected to the memory card 30. The navigation apparatus 10 transmits data to the memory card reader/writer 20 via the bus, and directs the memory card reader/writer 20 to read data from, write data into, and delete data from the memory card 30 connected to the memory card reader/writer 20.

The structures of the in-vehicle system 1, memory card reader/writer 20, and memory card 30 constituting the navigation apparatus 10 are explained.

(1) Structure of the Navigation Apparatus 10

The block diagram of FIG. 1 shows the structure of the navigation apparatus 10 constituting the in-vehicle system 1. The navigation apparatus 10 includes an operation section 11, a display section 12, a speaker 13, a storage section 14, a communication section 15, a control section 16, a position detector 17, an external communication device 18, and an in-vehicle LAN communication section 19.

The operation section 11 receives various instructions from a user, and specifically includes a mechanical key switch, a touch switch, etc.

The display section 12 displays various indications, and specifically includes an LCD, organic EL, etc.

The speaker 13 outputs sound in accordance with signals inputted from the control section 16. The storage section 14 includes a device not requiring data retention (for example, a HDD), and can store various information.

The storage section 14 stores a rewrite management table and a refresh start condition table, which are mentioned later.

A communication section 15 communicates with the memory card reader/writer 20 via the bus. The control section 16 includes a known microcomputer having, e.g., a CPU, a ROM, a RAM, an I/O, and a bus line by which these components are connected. The control section 16 controls each section of the navigation apparatus 10 in accordance with a program stored in the ROM. The control section 16 identifies a route to a destination of a user in accordance with map data stored in the memory card 30 and a current position of a user's vehicle detected by the position detector 17, and executes a known route guidance to the destination of the user in accordance with the identified route. The control section 16 communicates with the memory card reader/writer 20 via the communication section 15, and executes a read of data from, a write of data into, and a deletion of data from the memory card 30 connected to the memory card reader/writer 20.

A flash memory constituting the memory card 30 includes one or more blocks. The block is a minimum unit by which data can be deleted independently. The deletion of data is done by this block unit. The control section 16 has a calendar function and can identify a current date.

The position detector 17 includes; a GPS receiver 17a which receives electric waves from a satellite for GPS (Global Positioning System) via a GPS antenna (not shown) to detect a position, direction, speed, etc. of the vehicle; a gyroscope 17b which detects a magnitude of a rotational motion added to the vehicle; and a distance sensor 17c which detects a travel distance from, e.g., acceleration in the longitudinal direction of the vehicle. Since these components have errors whose characteristics are different from each other, they are structured to supplement each other.

The external communication device 18 acquires traffic information (accident information, congestion information, etc.) from an information center of VICS via such as a radio beacon, and an optical beacon, which are installed to roadsides. The external communication device 18 also acquires the traffic information transmitted by FM multiplex broadcasting.

The in-vehicle LAN communication section 19 transmits and receives a variety of information via the in-vehicle LAN (not shown).

(2) Structure of the Memory Card Reader/Writer 20

The structure of the memory card reader/writer 20 is explained below.

The memory card reader/writer 20 includes the memory card 30 detachably.

The memory card reader/writer 20 and memory card 30 are connected to each other by inserting the memory card 30 into a slot of the memory card reader/writer 20. The memory card reader/writer 20 executes a write and deletion of data into and from the memory card 30 in accordance with instructions from the navigation apparatus 10. The memory card reader/writer 20 reads data from the memory card 30 in accordance with instructions from the navigation apparatus 10, and transmits the read data to the navigation apparatus 10 via the bus. The memory card reader/writer 20 identifies sizes of the blocks of the flash memory constituting the memory card 30 connected to the reader/writer 20, and identifies a starting address of each block.

Figure 2A:
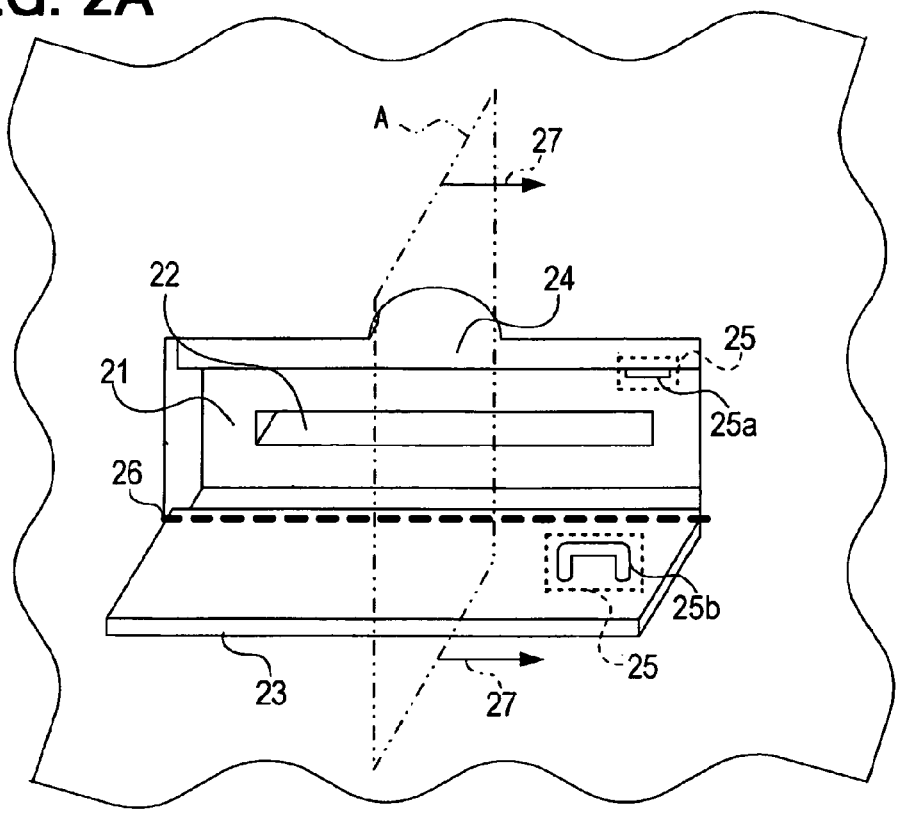
FIGS. 2A, 2B, 2C illustrate a structure around a slot of a memory card reader/writer.
Figure 2B:
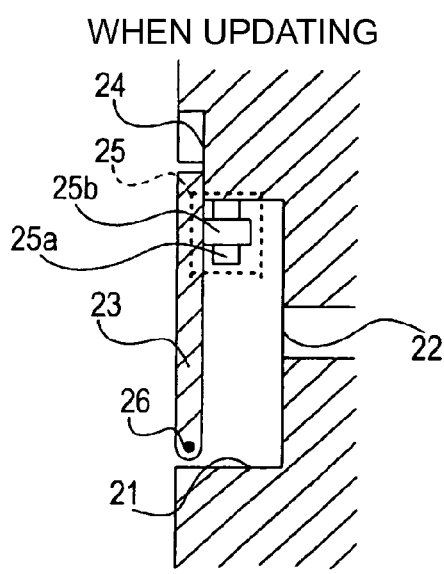
Figure 2C:
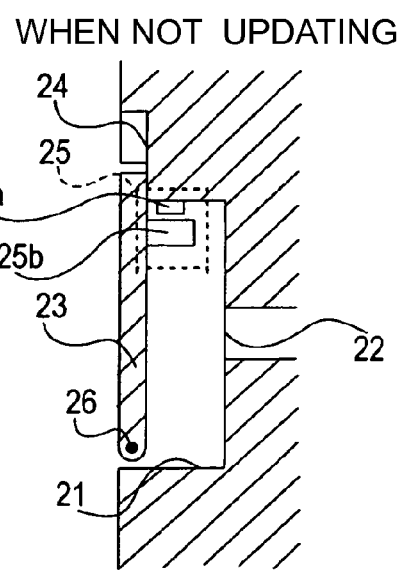

FIG. 2A is a perspective view of a slot 22 of the memory card reader/writer 20 viewed from the front. FIGS. 2B and 2C are sectional views of a cross section A in the perspective view of FIG. 2A viewed in the direction of an arrow 27.

The structure around the slot 22 of the memory card reader/writer 20 is explained using FIG. 2A. A recess 21 is formed to a predetermined area in a vehicle interior, and the slot 22 is formed to a bottom surface of the recess 21 (the portion where the recess 21 is disposed is mentioned later). A shaft 26 is supported by walls of both ends in the longitudinal direction of the recess 21 and formed to the lower side in the vertical direction perpendicular to the longitudinal direction. A lid 23 is provided to be supported by this shaft. A supporting portion 24 supporting the closed lid 23 is formed to the vertical upper side of the recess 21. A projection 25a extending and retracting vertically in accordance with an instruction from the navigation apparatus 10, is provided to the upper side in the vertical direction of the recess 21. An insertion hole 25b is provided to the lid 23 such that the projection 25a is inserted into the insertion hole 25b when the lid 23 is closed and the projection 25a extends downward. A locking mechanism 25 locks the closed lid 23 by use of the projection 25a and insertion hole 25b.

FIGS. 2B and 2C are sectional views of the cross section A of the perspective view of FIG. 2A seen in the direction of the arrow 27 when the lid 23 is closed. Operations of the locking mechanism 25 are explained using FIGS. 2B and 2C.

FIG. 2B shows the locking mechanism 25 when the memory card reader/writer 20 updates data of the memory card 30. The memory card reader/writer 20 extends the projection 25a downward, and the extended projection 25a is inserted into the insertion hole 25b, so that the lid 23 is locked. The update of data of the memory card 30 means the write or deletion of data into or from the memory card 30.

FIG. 2C shows the locking mechanism 25 when the memory card reader/writer 20 does not update data of the memory card 30. The memory card reader/writer 20 unlocks the lid 23 by retracting the projection 25a inserted into the insertion hole 25b when the update of the data of the memory card 30 is complete.

(3) Structure of the Memory Card 30

The structure of the memory card 30 is explained below. The memory card 30 includes a NAND flash memory etc. The NAND flash memory constituting the memory card 30 includes one or more blocks. The block is the minimum unit in which data can be deleted independently. When overwriting data into the flash memory, it is necessary to write the data after deleting the stored data. The overwrite of data is executed by the block unit. This block includes multiple pages. The page is the minimum unit of writing data.

The memory card 30 stores map data, facility retrieval data, and program data. This map data is used in the route guidance by the control section 16 constituting the navigation apparatus 10. Road types and positions of and information about facilities can be identified from the map data. The map data, facility retrieval data, and program data each include multiple files.

First Embodiment

In the in-vehicle system 1 of a first embodiment, a refresh start condition is provided in a file stored in the memory card 30 in accordance with a risk (or referred to as "a degree of risk") of occurrence of a data retention problem. It is determined whether such a refresh start condition is satisfied. The in-vehicle system 1 of the first embodiment is explained below.

In the first embodiment, when the user's vehicle mounting the in-vehicle system 1 receives, from the user, an operation of completing the drive, i.e., driving of the vehicle, the in-vehicle system 1 transfers to a power saving mode, in which less power is used compared to the duration of driving.

Arrangement

The arrangement of the memory card reader/writer 20 constituting the in-vehicle system 1 of the first embodiment is explained.

Figure 3A:
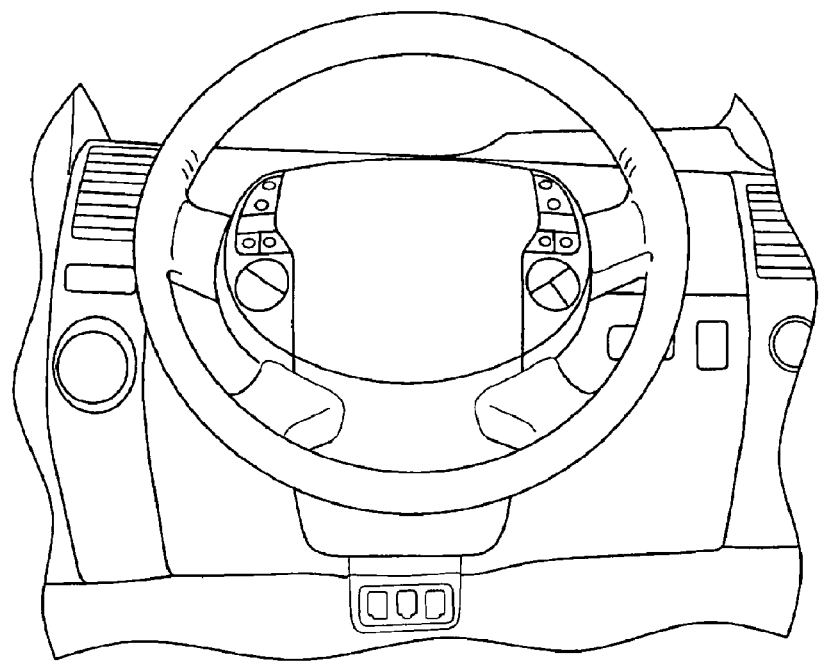
FIGS. 3A, 3B are front views of a steering wheel portion of a user's vehicle.
Figure 3B:
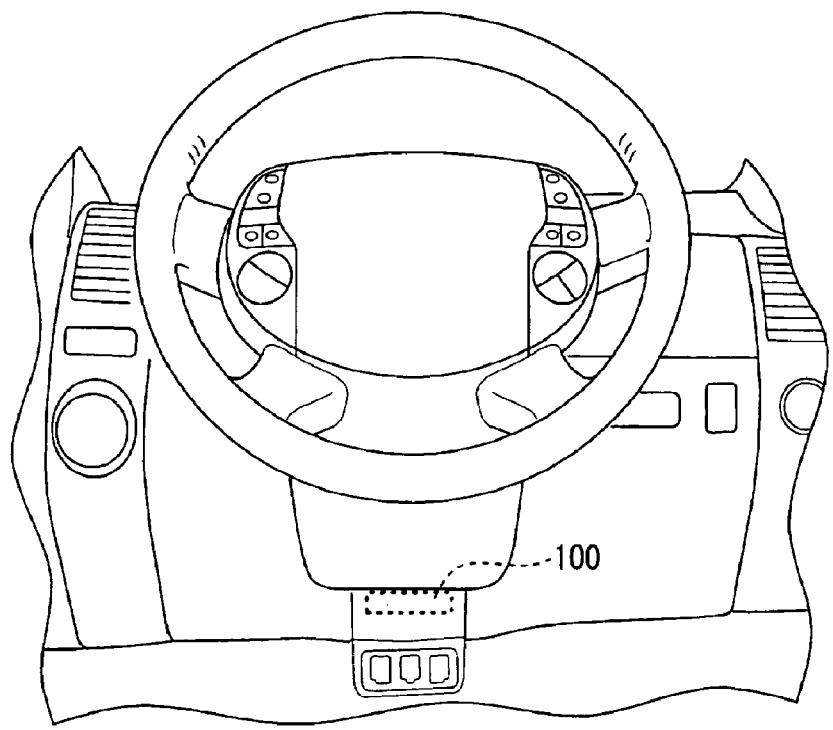

FIGS. 3A and 3B are front views of a steering wheel portion of the user's vehicle mounting the in-vehicle system 1, viewed from the driver's seat. The inclination and vertical position of the steering wheel portion are adjusted by a steering wheel adjustment device (not shown) mounted in the user's vehicle. When the drive is complete (for example, the key is removed), the steering wheel adjustment device inclines the steering wheel portion upward, and moves the steering wheel portion upward, to permit the driver to get out of the vehicle easily. When the driving is started (for example, the key is inserted), the steering wheel adjustment device inclines the steering wheel portion downward, and moves the steering wheel portion downward.

FIG. 3A shows the steering wheel portion after the steering wheel adjustment device adjusts the position and inclination of the steering wheel portion at the start of the driving. FIG. 3B shows the steering wheel portion after the steering wheel adjustment device adjusts the position and inclination of the steering wheel portion at the end of the driving.

An arrangement area 100 of FIG. 3B appears when the steering wheel adjustment device moves the steering wheel portion upward at the end of the driving. The recess 21 of the memory card reader/writer 20 of FIG. 2A is disposed to the arrangement area 100.

Explanation of Operation

The operation of the in-vehicle system 1 of the first embodiment is explained below.

(1) Rewrite Management Table

The rewrite management table stored in the storage section 14 of the navigation apparatus 10 constituting the in-vehicle system 1 of the first embodiment is explained first.

The table of FIG. 4 shows the rewrite management table. Records constituting the rewrite management table correspond to files stored in the memory card 30 connected to the memory card reader/writer 20. The rewrite management table includes items "ID," "file name," "number of updates," "date of write," "risk," "address," and "file size."

The "ID" shows a number used for identifying a record constituting the rewrite management table. The "file name" shows a name of a file corresponding to a record.

The "number of updates" shows the number of updates of data in a block which overlaps with an area storing a file corresponding to a record and which has the highest number of updates of data.

The "date of write" shows a date in which a file corresponding to a record is written in the memory card 30. The "risk" shows a risk of occurrence of the data retention problem in a file corresponding to a record. The risk of occurrence of the data retention problem is shown by five levels of Lv0 to Lv4. When a new file is written in the memory card 30, the risk of this file is set to Lv0, and the level rises over time. The "risk" includes four items (i.e., four item names), in an order from a low level to a high level, "Lv1," "Lv2," "Lv3," and "Lv4," each item corresponding to a level of a risk shown by the item name. A date or a null is set to these items. The date set to each item shows the date in which a risk has been set to the level shown by the item name. The null value shows that the risk does not reach the level shown by the item name. When nulls are set as all of "Lv1" to "Lv4," the risk of the file corresponding to this record is set to Lv0.

The "address" shows a starting address of an area where a file corresponding to a record is stored in the flash memory constituting the memory card 30. The "file size" shows a size of a file corresponding to a record.

The control section 16 constituting the navigation apparatus 10 of the first embodiment reads a file stored in the memory card 30, and stores the file in the RAM of the control section 16 in accordance with information shown by the rewrite management table. Then, the control section 16 overwrites the stored file in the same area again. This processing is the refresh.

(2) Refresh Start Condition Table

The refresh start condition table is explained below. The refresh start condition is a condition under which a refresh for a file stored in the memory card 30 constituting the in-vehicle system 1 of the first embodiment is started. The refresh start condition table is stored in the storage section 14 of the navigation apparatus 10 constituting the in-vehicle system 1 of the first embodiment. The refresh start conditions are registered in the refresh start condition table. The user can set the refresh start conditions (the detail is mentioned later).

Figures 5, 6:
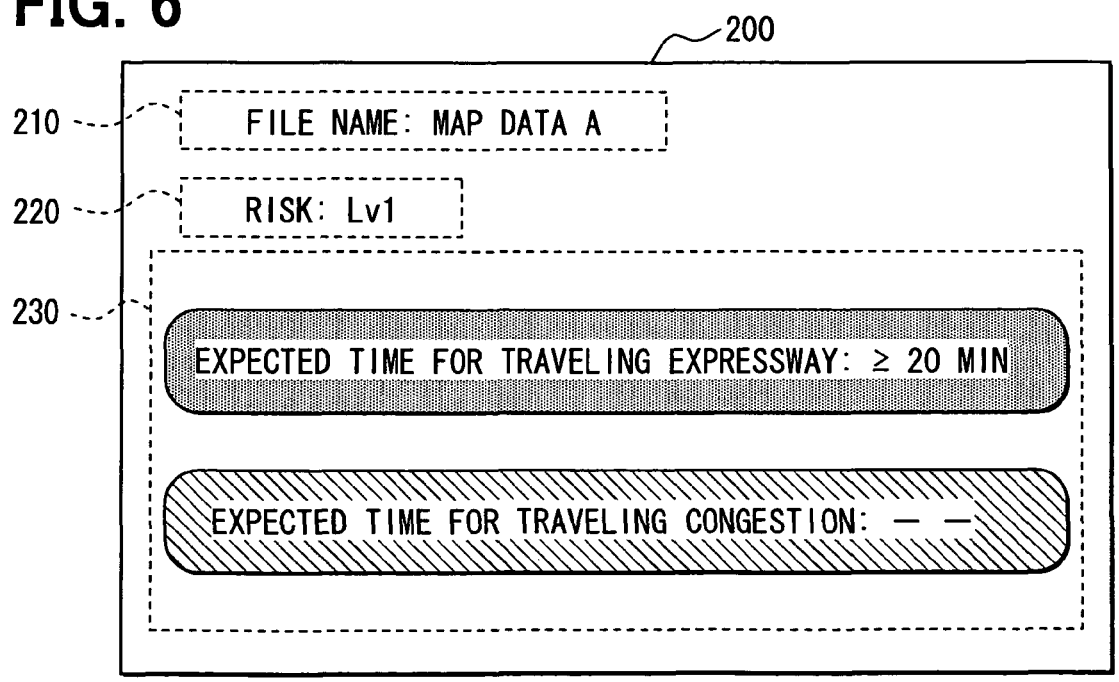
FIG. 5 is a diagram to show a refresh start condition.
FIG. 6 shows a setting window for setting the refresh start condition.

The table of FIG. 5 shows the refresh start condition table. The records of the refresh start condition table correspond to the files stored in the memory card 30, and show the refresh start conditions of the corresponding files. The refresh start condition table includes items of "ID," "file name," and "refresh start condition."

The "ID" shows a number for identifying a record constituting the refresh start condition table. The "file name" shows a name of a file corresponding to a record.

The "refresh start condition" shows a refresh start condition of a file corresponding to a record. Each refresh start condition is set in accordance with a risk of occurrence of the data retention problem in the file corresponding to each record. The "refresh start condition" includes items of "Lv1," "Lv2," and "Lv3." These items each show the refresh start condition corresponding to the level of the risk shown by the name of each item. When the risk is Lv0, the risk of occurrence of the data retention problem is dramatically low, the refresh is not done, and thus there is no refresh start condition corresponding to Lv0. Since the refresh is compulsorily done when the risk is Lv4, there is no refresh start condition according to Lv4 (the detail is mentioned later).

The refresh start conditions are explained concretely below. The refresh start condition is one of a condition about an expected time during which the user's vehicle travels on an expressway and a condition about an expected time during which the user's vehicle travels on a congested section. The condition about the expected time during which the user's vehicle travels on an expressway means that when an expected time during which the user's vehicle travels on an expressway is a threshold or over, the refresh is started. The conditions about an expected time during which the user's vehicle travels on a congested section means that, when an expected time during which the user's vehicle travels on a congested section is a threshold or over, the refresh is started.

The user can set the refresh start conditions registered in the refresh start condition table (the detail is mentioned later). The refresh start condition for a higher risk may be satisfied easier than the refresh start condition for a lower risk in the refresh start condition table. At the time of shipment from the factory, a condition that "an expected time during which the user's vehicle travels on an expressway is thirty minutes or over" may be set as the condition for the risk of Lv1. At the time of shipment from the factory, a condition that "an expected time during which the user's vehicle travels on an expressway is fifteen minutes or over" may be set as the condition for the risk of Lv2. At the time of shipment from the factory, a condition that "an expected time during which the user's vehicle travels on an expressway is five minutes or over" may be set as the condition for the risk of Lv3. When the risk of occurrence of the data retention problem is high, the refresh can be started more immediately compared to the case of the low risk.

(3) Setting Window for the Refresh Start Condition

The user can set the refresh start conditions registered in the refresh start condition table. FIG. 6 shows a setting window 200 displayed on the display section 12 of the navigation apparatus 10 when the user sets the refresh start conditions.

The setting window 200 includes a file name display 210, a risk display 220, and a condition display 230. The file name display 210 shows a file name of the selected file. The file name display 210 of the setting window 200 shows that map data A is selected as the file.

The risk display 220 shows a level of the selected risk. The risk display 220 of the setting window 200 shows that Lv1 is selected as a level of the risk.

The condition display 230 shows the refresh start condition which can be set by the user and the current refresh start condition. The condition display 230 of the setting window 200 shows that either the condition about the expected time during which the user's vehicle travels on an expressway or the condition about the expected time during which the user's vehicle travels in a traffic congestion section can be set as the refresh start condition. The current refresh start condition shows the conditions about the expected time during which the user's vehicle travels on an expressway, and specifically illustrates "EXPECTED TIME FOR TRAVELING EXPRESSWAY: ≧20 MIN" signifying that the expected time during which the user's vehicle travels on an expressway is twenty minutes or over.

(4) Rewrite

Figure 7:
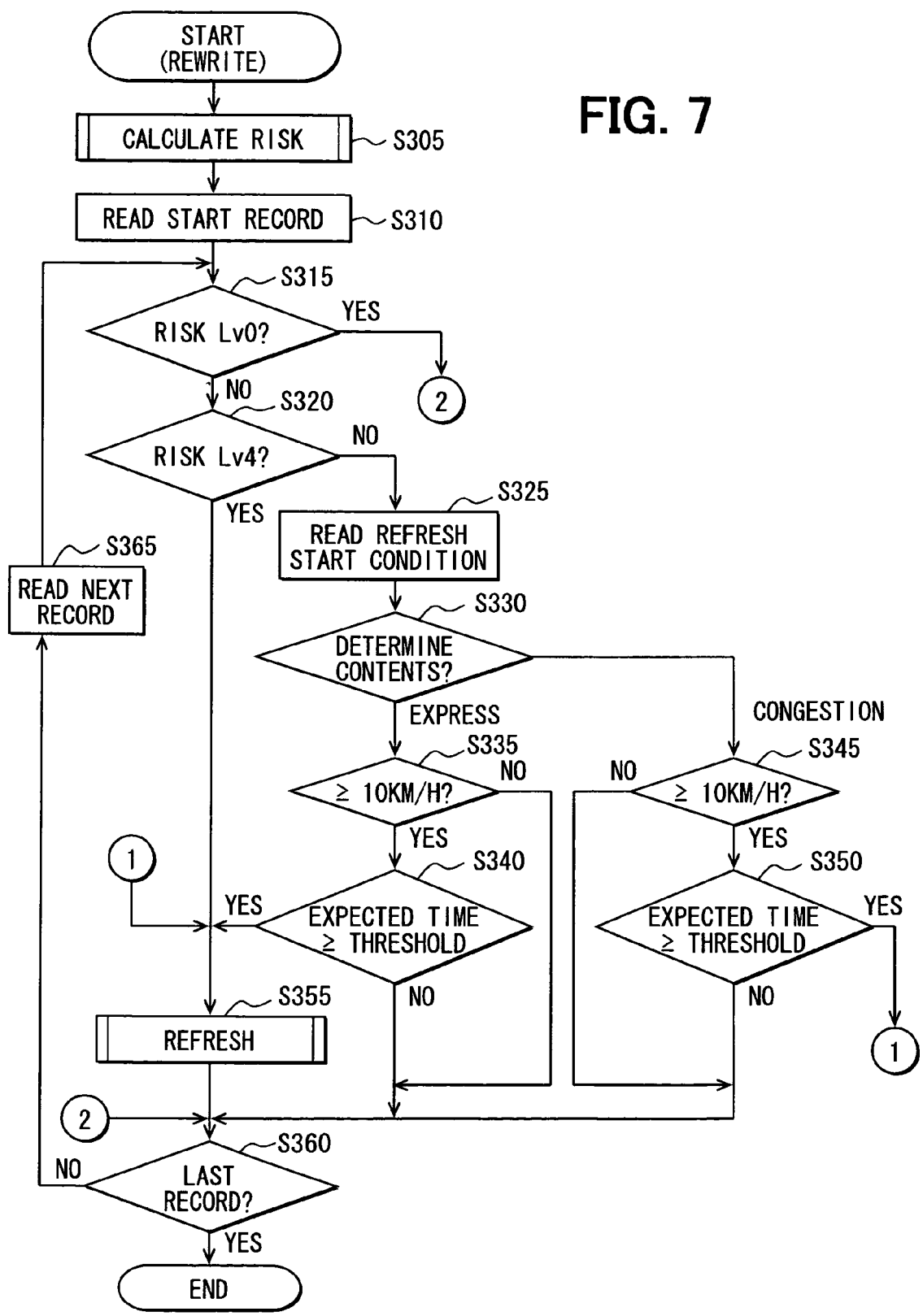
FIG. 7 is a flowchart of a rewrite.

A periodical rewrite executed by the in-vehicle system 1 of the first embodiment during the driving of the user's vehicle is explained using the flowchart of FIG. 7.

In S305, the control section 16 constituting the navigation apparatus 10 of the in-vehicle system 1 executes a risk calculation, which is a subroutine. The risk calculation is executed for calculating the risk of occurrence of the data retention problem in the file stored in the memory card 30 connected to the memory card reader/writer 20. The process of the control section 16 shifts the processing to S310 after the risk calculation.

In S310, the control section 16 reads a starting record of the rewrite management table stored in the storage section 14, stores the record temporarily in a predetermined area of the RAM of the control section 16, and shifts the processing to S315.

In S315, the control section 16 determines whether a "risk" of this record is Lv0 with reference to the record temporarily stored in the predetermined area of the RAM. When the "risk" is Lv0 (S315: Yes), the flow shifts to S360, and when the "risk" is not Lv0 (S315: No), the flow shifts to S320.

In S320, the control section 16 determines whether the "risk" of the record temporarily stored in the predetermined area of the RAM is Lv4 with reference to this record. When the "risk" is Lv4 (S320: Yes), the flow shifts to S355, and when the "risk" is not Lv4 (S320: No), the flow shifts to S325.

In S325, the control section 16 identifies a "file name" and "risk" of the record temporarily stored in the predetermined area of the RAM with reference to this record. The control section 16 reads the refresh start condition corresponding to the "file name" and "risk" of this record from the refresh start condition table stored in the storage section 14, stores the condition temporarily in the RAM, and shifts the processing to S330.

In S330, the control section 16 checks the contents of the refresh start condition temporarily stored in the RAM in S325. When this refresh start condition is about an expected time during which the user's vehicle travels on an expressway, the control section 16 shifts the processing to S335. When this refresh start condition is about an expected time during which the user's vehicle travels in a traffic congestion section, the control section 16 shifts the processing to S345.

In S335, the control section 16 identifies a current position of the user's vehicle by use of the position detector 17, and reads map data around the current position of the user's vehicle from the memory card 30. The control section 16 identifies a road on which the user's vehicle is traveling in accordance with the current position of the user's vehicle and the map data around the current position. The control section 16 acquires, e.g., a speed of the user's vehicle via the in-vehicle LAN communication section 19. When the speed of the user's vehicle is ten km/h or more and when the user's vehicle travels on an expressway, the control section 16 shifts the processing to S340. When the speed of the user's vehicle is less than ten km/h, or when the road on which the user's vehicle is traveling is not the expressway, the control section 16 shifts the processing to S360.

In S340, the control section 16 calculates an expected time during which the user's vehicle travels on the expressway in accordance with the speed of the user's vehicle acquired via the in-vehicle LAN communication section 19. For example, the control section 16 may specify a travel distance on the expressway in accordance with a route of the route guidance when the route guidance is being executed, and may calculate the expected time during which the user's vehicle travels on the expressway in accordance with the travel distance and speed of the user's vehicle. When the expected time during which the user's vehicle travels on the expressway is over a threshold, the control section 16 shifts the processing to S355. When the expected time during which the user's vehicle travels on the expressway is less than the threshold, the control section 16 shifts the processing to S360.

In S345, the control section 16 identifies the current position of the user's vehicle by use of the position detector 17, and reads the map data around the current position of the user's vehicle from the memory card 30. The control section 16 acquires traffic information around the current position via the external communication device 18. The control section 16 identifies the traffic situation of the road around the current position in accordance with the current position of the user's vehicle, the map data around the current position, and the traffic information around the current position. The control section 16 acquires, e.g., the speed of the user's vehicle via the in-vehicle LAN communication section 19. When the speed of the user's vehicle is ten km/h or more, and when the user's vehicle travels in the traffic congestion section, the control section 16 shifts the processing to S350. When the rate of the user's vehicle is less than ten km/h, or when the road on which the user's vehicle is traveling is not congested, the control section 16 shifts the processing to S360.

In S350, the control section 16 calculates the expected time during which the user's vehicle travels in the traffic congestion section. For example, specifically, the control section 16 may specify the road condition of the route of the route guidance in accordance with the traffic information around the current position acquired via the external communication device 18 when the route guidance is being executed, and may calculate the expected time during which the user's vehicle travels in the traffic congestion section. When the expected time during which the user's vehicle travels in the traffic congestion section is over a threshold, the control section 16 shifts the processing to S355. When the expected time during which the user's vehicle travels in the traffic congestion section is less than the threshold, the control section 16 shifts the processing to S360.

In S355, the control section 16 executes the refresh, which is a subroutine. At this time, the control section 16 executes the refresh by using, as an input argument, the record temporarily stored in the predetermined area of the RAM. The control section 16 shifts the processing to S360 after the execution of the refresh.

In S360, the control section 16 determines whether the record temporarily stored in the predetermined area of the RAM is the last record of the rewrite management table. When the control section 16 determines that the record is the last one (S360: Yes), the control section 16 terminates the rewrite. When the control section 16 determines that the record is not the last one (S360: No), the control section 16 shifts the processing to S365.

In S365, the control section 16 reads a record next to the record temporarily stored in the predetermined area of the RAM from the storage section 14, stores the next record temporarily in the predetermined area of the RAM, and shifts the processing to S315.

(5) Risk Calculation

Figure 8:
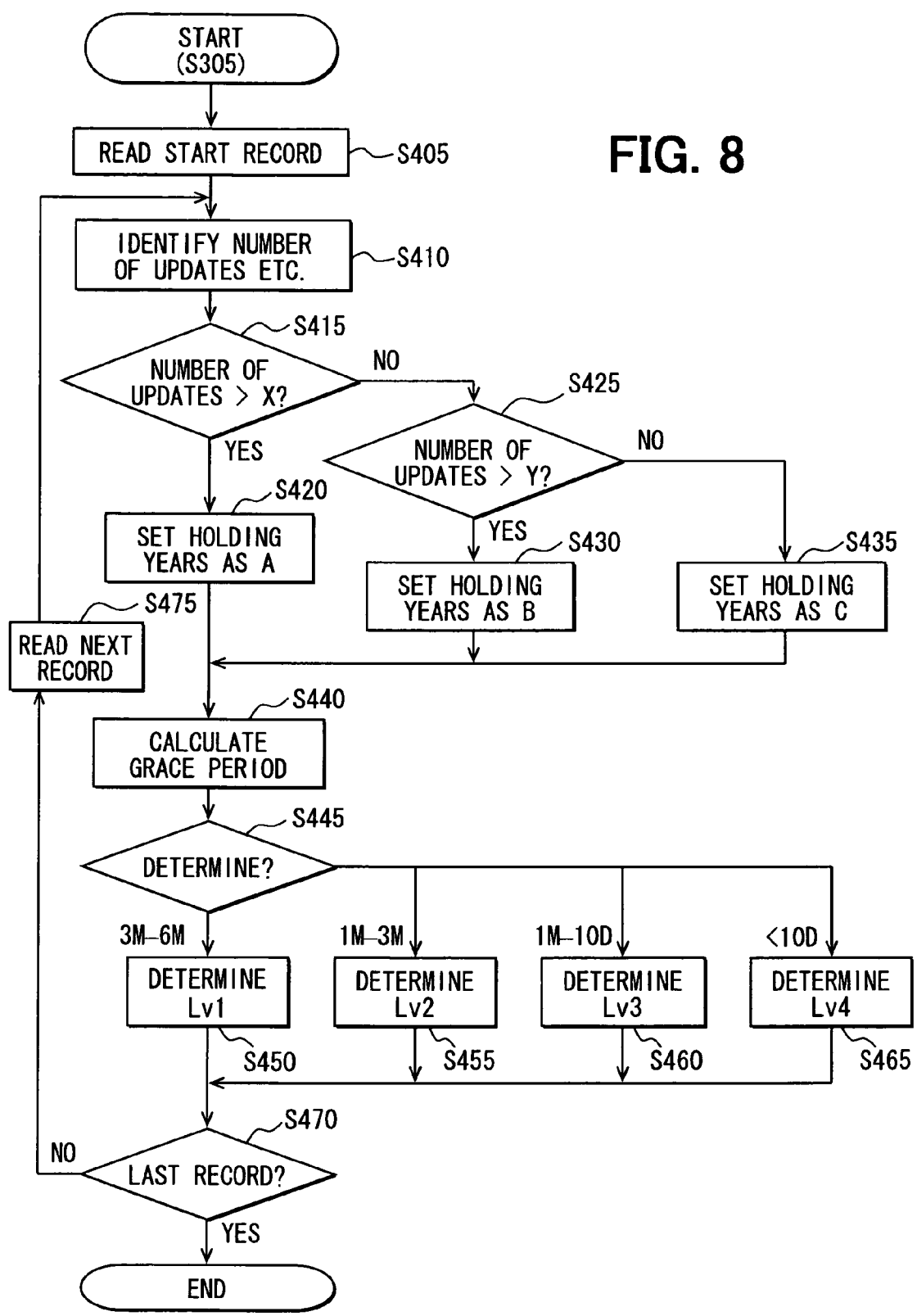
FIG. 8 is a flowchart of a risk calculation.

Risk calculation, which is the subroutine called from S305 of the rewrite of the first embodiment, is explained using the flowchart of FIG. 8.

In S405, the control section 16 constituting the navigation apparatus 10 of the in-vehicle system 1 reads a starting record of the rewrite management table stored in the storage section 14, stores the record temporarily in the RAM of the control section 16, and shifts the processing to S410.

In S410, the control section 16 identifies the "number of updates" and "date of write" of the record stored temporarily in the RAM with reference to this record. The control section 16 identifies a level of the risk of occurrence of the data retention problem in a file corresponding to the read record with reference to the "risk" of this record, and shifts the processing to S415.

In S415, the control section 16 determines whether the "number of updates" identified in S410 is more than X times. When "number of updates" identified in S410 is more than X times, the control section 16 shifts the processing to S420. When the "number of updates" is X times or below, the control section 16 shifts the processing to S425.

In S420, the control section 16 sets A years as a data holding period, and shifts the processing to S440. The data holding period is the period during which the flash memory constituting the memory card 30 can hold contents of the data written therein.

In S425, the control section 16 determines whether the "number of updates" identified in S410 is more than Y times. The control section 16 shifts the processing to S430 when the "number of updates" is more than Y times. When the "number of updates" is Y times or less, the control section 16 shifts the processing to S435.

In S430, the control section 16 sets B years as a data holding period, and shifts the processing to S440. In S435, the control section 16 sets C years as a data holding period, and shifts the processing to S440.

In S440, the control section 16 calculates a data holding deadline, which is the last date of the data holding period, in accordance with the "date of write" identified in S410 and with the data holding periods set in S420, S430, and S435. The control section 16 identifies a current date by use of the calendar function, calculates a grace period of up to the data holding deadline in accordance with the current date and the data holding deadline, and shifts the processing to S445.

In S445, the control section 16 determines the grace period calculated in S440. When the grace period is three months or more and less than six months, the control section 16 shifts the processing to S450. When the grace period is one month or more and less than three months, the control section 16 shifts the processing to S455. When the grace period is ten days or more and less than one month, the control section 16 shifts the processing to S460. When the grace period is less than ten days, the control section 16 shifts the processing to S465.

In S450, the control section 16 determines that the risk of occurrence of the data retention problem is Lv1. When the risk of occurrence of the data retention problem in the file corresponding to the record, the risk being identified in S410, is under Lv1, the control section 16 identifies the current date by use of the calendar function, sets the current date in the "Lv1" of the "risk" of the same record of the rewrite management table stored in the storage section 14, and shifts the processing to S470.

In S455, the control section 16 determines that the risk of occurrence of the data retention problem is Lv2. When the risk of occurrence of the data retention problem in the file corresponding to the record, the risk being identified in S410, is under Lv2, the control section 16 identifies the current date by use of the calendar function, sets the current date in the "Lv2" of the "risk" of the same record of the rewrite management table stored in the storage section 14, and shifts the processing to S470.

In S460, the control section 16 determines that the risk of occurrence of the data retention problem is Lv3. When the risk of occurrence of the data retention problem in the file corresponding to the record, the risk being identified in S410, is under Lv3, the control section 16 identifies the current date by use of the calendar function, sets the current date in the "Lv3" of the "risk" of the same record of the rewrite management table stored in the storage section 14, and shifts the processing to S470.

In S465, the control section 16 determines that the risk of occurrence of the data retention problem is Lv4. When the risk of occurrence of the data retention problem in the file corresponding to the record, the risk being identified in S410, is under Lv4, the control section 16 identifies the current date by use of the calendar function, sets the current date in the "Lv4" of the "risk" of the same record of the rewrite management table stored in the storage section 14, and shifts the processing to S470.

In S470, the control section 16 determines whether the record stored temporarily in the RAM is the last record of the rewrite management table. When the record stored temporarily in the RAM is the last one, the risk calculation is terminated. When the record stored temporarily in the RAM is not the last one, the processing shifts to S475.

In S475, the control section 16 reads a record next to the record stored temporarily in the RAM from the storage section 14, stores the next record temporarily in the RAM, and shifts the processing to S410. The relationship between X and Y, which are predetermined constants showing the number of updates used in S415 and S425 is X>Y The relationship among A, B, and C, which are predetermined constants showing the number of updates used in S420, S430, and S435 is C>B>A.

(6) Refresh

Figure 9:
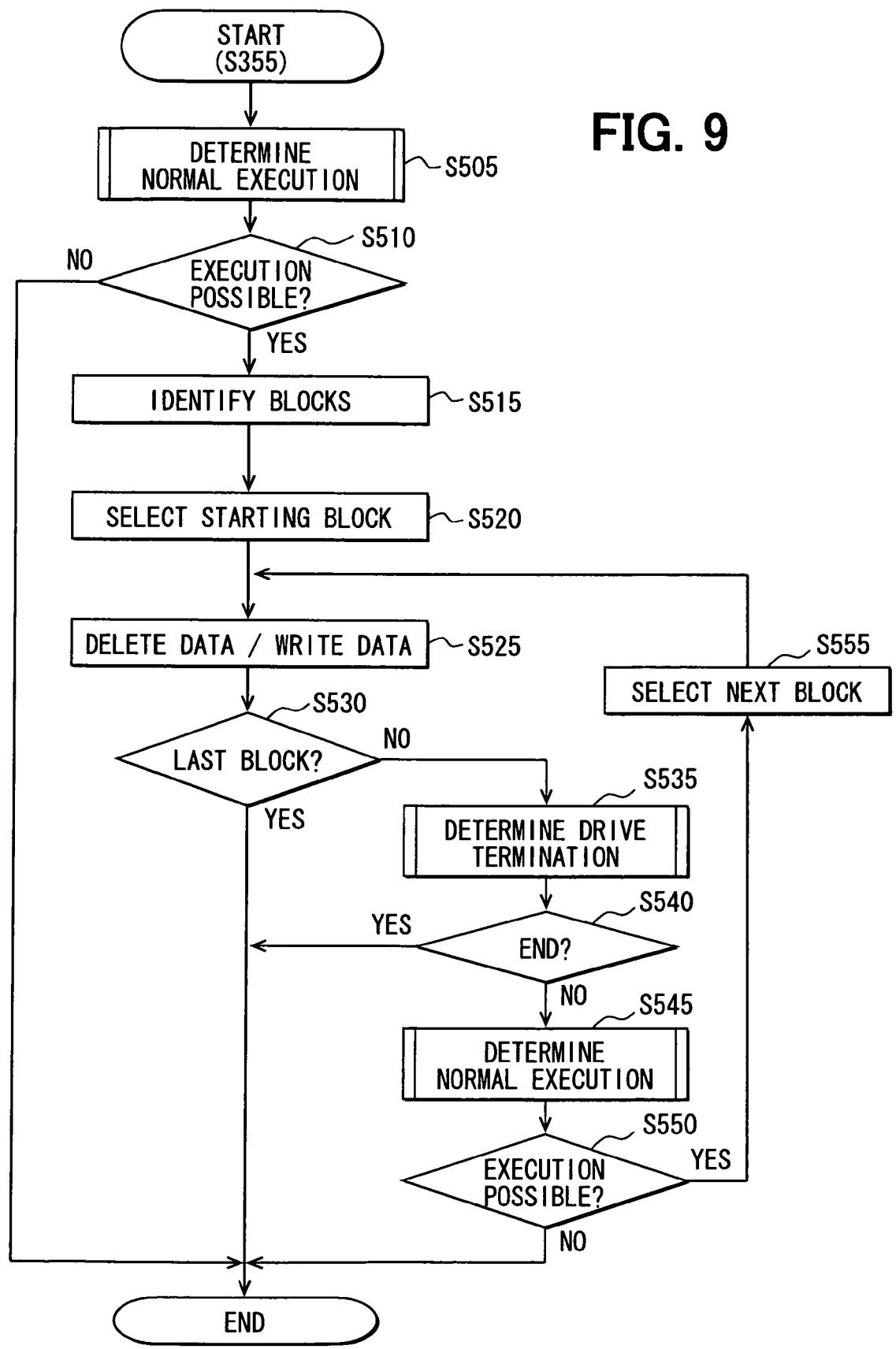
FIG. 9 is a flowchart of a refresh.

The refresh, which is the subroutine called from S355 of the rewrite of the first embodiment, is explained using a flowchart of FIG. 9.

In S505, the control section 16 constituting the navigation apparatus 10 of the in-vehicle system 1 executes a normal execution determination, which is a subroutine. The normal execution determination is executed for determining whether a normal execution of the refresh is possible. The control section 16 shifts the processing to S510 after the end of the normal execution determination.

In S510, the control section 16 determines whether the normal execution of the refresh is possible with reference to a return value of the normal execution determination executed in S505. When the control section 16 determines that the normal execution of the refresh is possible, the control section 16 shifts the processing to S515. When the control section 16 determines that the normal execution of the refresh is impossible, the control section 16 terminates the refresh.

In S515, the control section 16 references the "address" and "file size" of the record of the rewrite management table, which are delivered as input arguments, and identifies a starting address of the area storing the file corresponding to this record and a size of the file. The control section 16 acquires a starting address and size of each block of the flash memory constituting the memory card 30, which are identified the memory card reader/writer 20, via communication section 15. The control section 16 identifies the block(s), which overlaps with the area storing the file corresponding to the record, from the blocks of the flash memory constituting the memory card 30. The control section 16 reads data stored in these blocks, stores the data temporarily in the RAM of the control section 16, and shifts the processing to S520.

In S520, the control section 16 identifies the ascending order of the blocks of the memory card 30, the blocks being identified in S515, selects the starting block, and shifts the processing to S525.

In S525, the control section 16 deletes the data of the block of the memory card 30, the block being selected in S520 or S555. The control section 16 identifies, from the data read in S515, the data stored in the block from which the data is deleted, writes the identified data to the block from which the data is deleted, and shifts the processing to S530.

In S530, the control section 16 determines whether the selected block is the last block in the ascending order of the blocks identified in S520. When the control section 16 determines that the selected block is the last block, the control section 16 terminates the refresh. When the control section 16 determines that the selected block is not the last block, the control section 16 shifts the processing to S535.

In S535, the control section 16 executes a drive termination determination, which is a subroutine. The drive termination determination is executed for determining whether the situation in which the travel of the user's vehicle mounting the in-vehicle system 1 is terminated occurs. The control section 16 shifts the processing to S540 after the end of the drive termination determination.

In S540, the control section 16 determines whether the situation in which the travel of the user's vehicle is terminated occurs with reference to a return value of the drive termination determination executed in S535. When it is determined that the situation in which the travel of the user's vehicle is terminated occurs, the control section 16 terminates the refresh. When it is determined that the situation in which the travel of the user's vehicle is continued occurs, the control section 16 shifts the processing to S545.

In S545, the control section 16 executes the normal execution determination, which is the subroutine. This normal execution determination is executed for determining whether the normal execution of the refresh is possible. The control section 16 shifts the processing to S550 after the end of the normal execution determination.

In S550, the control section 16 determines whether the normal execution of the refresh is possible with reference to a return value of the normal execution determination executed in S545. When the control section 16 determines that the normal execution of the refresh is possible, the control section 16 shifts the processing to S555. When the control section 16 determines that the normal execution of the refresh is impossible, the control section 16 terminates the refresh.

In S555, the control section 16 newly selects the block next to the currently selected block in accordance with the order of the blocks identified in S520. The control section 16 shifts the processing to S525.

(7) Drive Termination Determination

Figure 10:
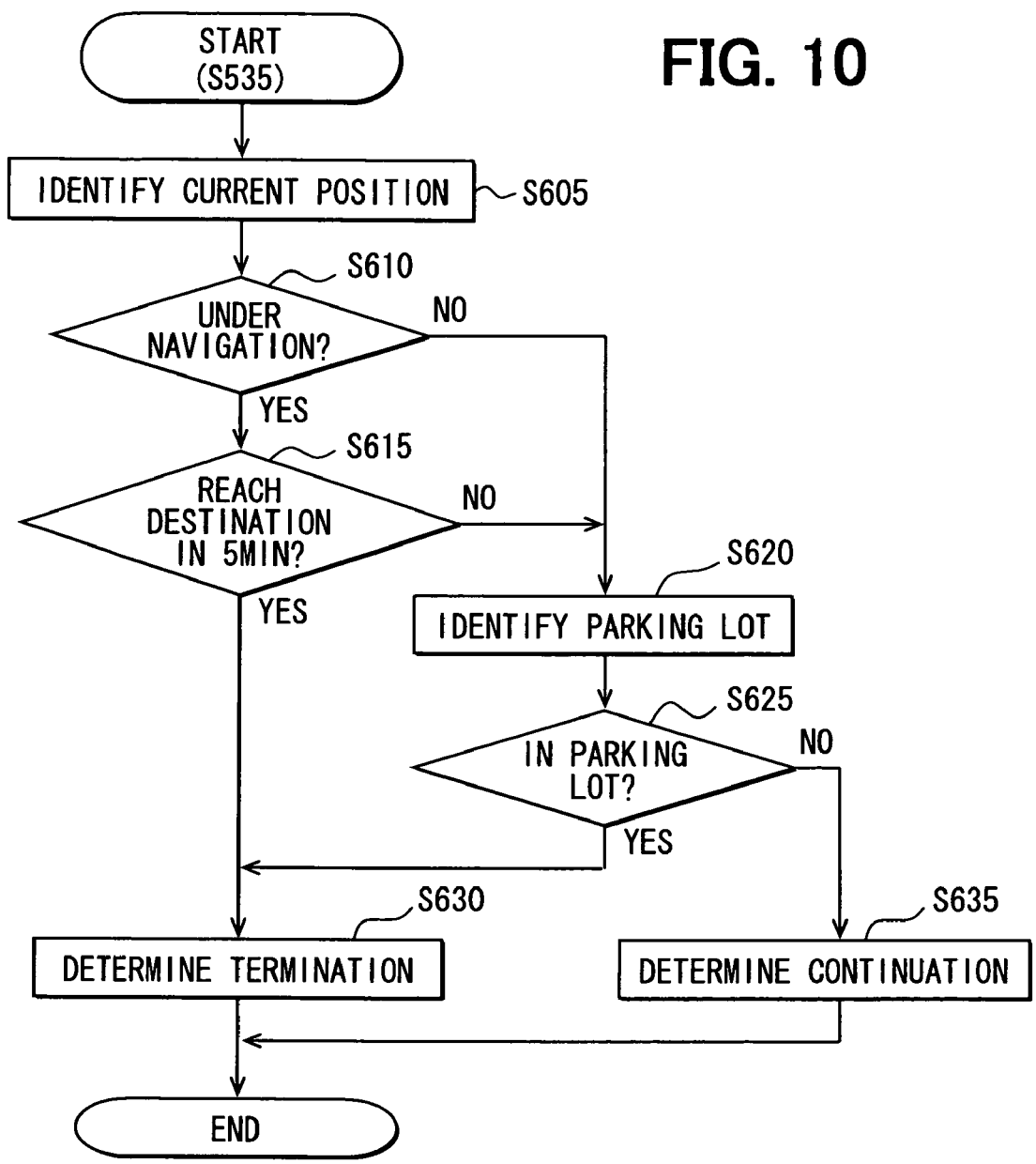
FIG. 10 is a flowchart of a drive termination determination.

The drive termination determination, which is the subroutine called from S535 of the refresh of the first embodiment, is explained using a flowchart of FIG. 10.

In S605, the control section 16 constituting the navigation apparatus 10 of the in-vehicle system 1 identifies a current position of the user's vehicle mounting the in-vehicle system 1 in accordance with a signal from the position detector 17, and shifts the processing to S610.

In S610, the control section 16 determines whether the route guidance is under execution. When the route guidance is under execution, the control section 16 shifts the processing to S615. When the route guidance is not under execution, the control section 16 shifts the processing to S620.

In S615, the control section 16 calculates an expected time until arrival to a destination in accordance with a route of the route guidance and the current position of the user's vehicle identified in S605. When the calculated expected time is less than five minutes, the control section 16 shifts the processing to S630. When the calculated expected time is five minutes or more, the control section 16 shifts the processing to S620.

In S620, the control section 16 identifies a parking lot around the current position of the user's vehicle identified in S605 in accordance with the map data stored in the memory card 30, and shifts the processing to S625.

In S625, the control section 16 determines whether the current position of the user's vehicle is in the parking lot identified in S620. When the control section 16 determines that the current position of the user's vehicle is in the parking lot, the control section 16 shifts the processing to S630. When the control section 16 determines that the current position of the user's vehicle is not in the parking lot, the control section 16 shifts the processing to S635.

In S630, the control section 16 determines that the situation in which the travel of the user's vehicle is terminated occurs, and terminates the drive termination determination. At this time, the control section 16 returns a signal showing that the situation in which the travel of the user's vehicle is terminated occurs.

In S635, the control section 16 determines that the situation in which the travel of the user's vehicle continues occurs, and terminates the drive termination determination. At this time, the control section 16 returns a value showing that the situation in which the travel of the user's vehicle continues occurs.

(8) Normal Execution Determination

Figure 11:
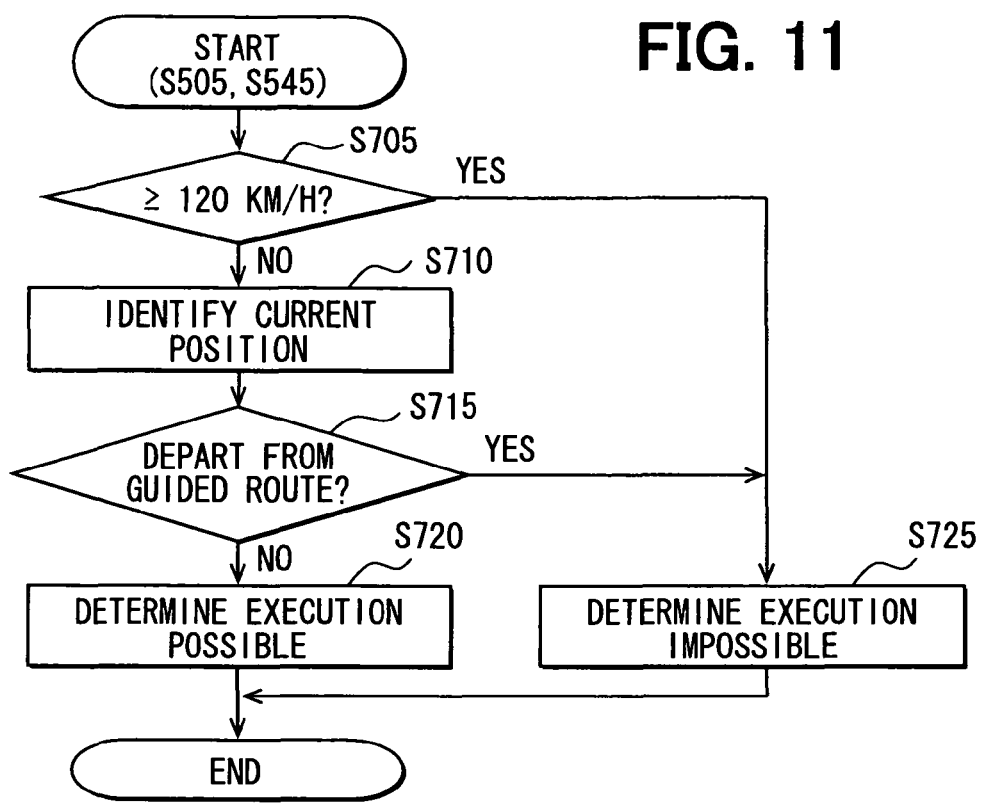
FIG. 11 is a flowchart of a normal execution determination.

The normal execution determination, which is the subroutine called from S505 and S545 of the refresh of the first embodiment, is explained using the flowchart of FIG. 11.

In S705, the control section 16 constituting the navigation apparatus 10 of the in-vehicle system 1 acquires a speed of the user's vehicle via the in-vehicle LAN communication section 19. When the speed of the user's vehicle is 120 km/h or more, the control section 16 shifts the processing to S725. When the speed of the user's vehicle is less than 120 km/h, the control section 16 shifts the processing to S710.

In S710, the control section 16 identifies the current position of the user's vehicle mounting the in-vehicle system 1 in accordance with a signal from the position detector 17, and shifts the processing to S715. In S715, the control section 16 identifies a road on which the user's vehicle is traveling in accordance with the map data stored in the memory card 30 and the current position of the user's vehicle identified in S710. When the control section 16 determines that the road on which the user's vehicle is traveling is one not used for the route guidance with reference to the map data stored in the memory card 30, the control section 16 shifts the processing to S725. When the control section 16 determines that the road on which the user's vehicle is traveling is one used for the route guidance, the control section 16 terminates the processing.

In S720, the control section 16 determines that the normal execution of the refresh is possible, and terminates the normal execution determination. At this time, the control section 16 returns a value showing that the normal execution of the refresh is possible.

In S725, the control section 16 determines that the normal execution of the refresh is impossible, and terminates the normal execution determination. At this time, the control section 16 returns a value showing that the normal execution of the refresh is impossible.

(9) Condition Setting

Figure 12:
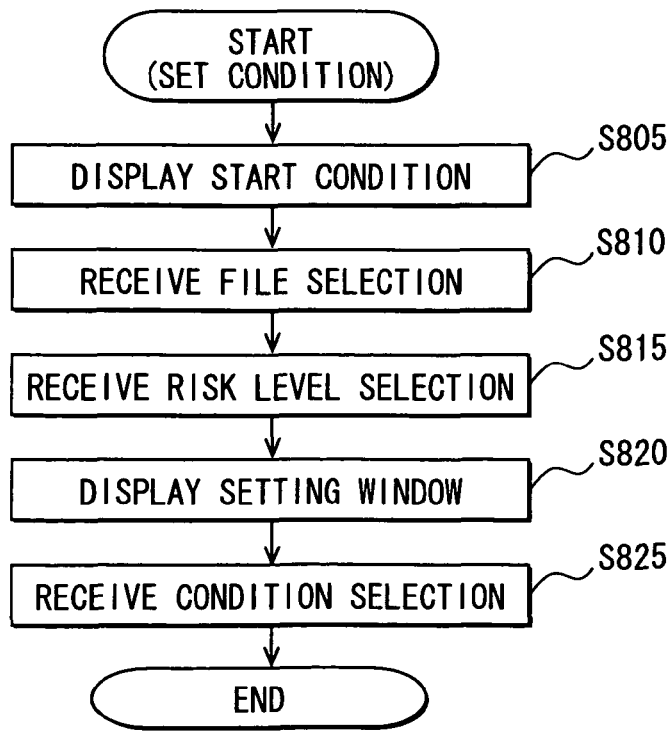
FIG. 12 is a flowchart of a condition setting.

A condition setting executed by the control section 16 of the navigation apparatus 10 constituting the in-vehicle system 1 in the first embodiment when the control section 16 receives a predetermined operation via the operation section 11 is explained using a flowchart of FIG. 12. The condition setting is executed for receiving, from the user, a setting of the refresh start condition registered in the refresh start condition table of FIG. 5.

In S805, the control section 16 reads the refresh start conditions of the risk levels 1 to 3 registered in the starting record of the refresh start condition table stored in the storage section 14, and displays the conditions on the display section 12, and shifts the processing to S810.

In S810, the control section 16 receives a selection of a file corresponding to the refresh start conditions set by the user via the operation section 11. At this time, on each reception of the selection of the file, the control section 16 reads a file name of the newly selected file and the refresh start conditions of the risk level 1 to level 3 corresponding to this file from the refresh start condition table stored in the storage section 14, and displays the file name and the conditions on the display section 12. When the reception of the selection of the file is complete, the control section 16 shifts the processing to S815.

In S815, the control section 16 receives a selection of the level of the risk of the refresh start condition from the user via the operation section 11, and shifts the processing to S820. In S820, the control section 16 displays, on the display section 12, the selected file received in S810 and the setting window to set the refresh start condition corresponding to the selected risk level received in S815. The setting window 200 of FIG. 6 is an example of the setting window displayed at this time. The control section 16 shifts the processing to S825.

In S825, the control section 16 receives a selection of one the condition about the expected time during which the user's vehicle travels on an expressway and the condition about the expected time during which the user's vehicle travels in the traffic congestion section via the operation section 11 from the user as the refresh start condition. Specifically, the condition about the expected time during which the user's vehicle travels on an expressway is such that the refresh is started when the expected time during which the user's vehicle travels on an expressway is over a threshold. When the control section 16 receives a selection of the condition about the expected time during which the user's vehicle travels on an expressway, the control section 16 receives a setting of a threshold of this expected time from the user via the operation section 11. Specifically, the condition about the expected time during which the user's vehicle travels in a traffic congestion section is such that the refresh is started when the expected time during which the user's vehicle travels in a traffic congestion section is over a threshold. When receiving a selection of the condition about the expected time during which the user's vehicle travels in a traffic congestion section, the control section 16 receives a setting of a threshold of the expected time from the user via the operation section 11. The control section 16 registers the newly selected refresh start condition and its threshold in the refresh start condition table stored in the storage section 14. The control section 16 terminates the condition setting.

Advantage

According to the in-vehicle system 1 of the first embodiment, the navigation apparatus 10 executes a refresh of a file corresponding to a refresh start condition when the refresh start condition is satisfied (S340: Yes, S350: Yes). This configuration of the first embodiment can therefore prevent the following situations: the refresh is continued even after the end of the driving; the refresh is thereby executed after the in-vehicle system 1 enters the power save mode; and, the power consumption due to the refresh is eventually increased.

One of the refresh start conditions is such that the user's vehicle travels on an expressway at 10 km/h or more and that the expected time during which the user's vehicle travels on the expressway is over the threshold (S335, S340). It is not likely that the drive is stopped in the middle of the travel on an expressway. Therefore, the possibility that the refresh is interrupted by the end of the driving can be reduced by starting the refresh during the travel of the vehicle on the expressway when the expected time during which the vehicle travels on this expressway is long enough.

One of the refresh start conditions is such that the user's vehicle travels in the traffic congestion section at 10 km/h or more and that the expected time during which the user's vehicle travels in this traffic congestion section is more than the threshold (S345, S350). Generally, it is not likely that the possibility that the driving is stopped in the middle of the travel in the traffic congestion section. Therefore, the possibility that the refresh is interrupted by the end of the driving can be reduced by starting the refresh during the travel of the vehicle in the traffic congestion section when the expected time during which the vehicle travels in this traffic congestion section is long enough.

The user can select one of the two conditions mentioned above as the refresh start condition, and can set a threshold of the expected time in the selected condition (S825). Therefore, the user can set the optimum condition in accordance with the route on which the user's vehicle usually travels, improving the convenience of the in-vehicle system 1.

The navigation apparatus 10 does not refresh the file in which the risk of the occurrence of the data retention problem is Lv0 (S315: Yes). Therefore, the refresh can be executed only when the possibility that the data retention problem occurs is high, and the unnecessary processing load of the control means can be thus prevented. Flash memories have the limited number of writes. The write of data cannot be executed in the area in which the number of writes reaches the limited number. Therefore, the refresh is executed only when the risk is Lv1 or more, so that the increase in the number of writes of data can be suppressed, and the life of the flash memory can be thus prolonged.

The refresh start condition can be set to the navigation apparatus 10 in accordance with the risk of occurrence of the data retention problem. Therefore, as the refresh start condition corresponding to the case where the risk of occurrence of the data retention problem is high, the condition easier satisfied compared with the case where the risk of occurrence of the data retention problem is low can be set. When the risk of occurrence of the data retention problem is high, the refresh can be started more immediately compared with the case where the risk is low.

The refresh start conditions based on the files stored in the memory card 30 are set in the navigation apparatus 10. Therefore, the suitable refresh start conditions can be set in accordance with the importance and sizes of the files.

The navigation apparatus 10 calculates the risk of occurrence of the data retention problem in accordance with a period elapsed after the file is stored in the memory card 30. Therefore, the risk of occurrence of the data retention problem is appropriately computable.

The navigation apparatus 10 calculates the risk of occurrence of the data retention problem in consideration of the number of the updates of the block having the most data updates among the blocks which overlap with the area where the file is stored (S415, S425). Therefore, the risk of occurrence of the data retention problem can be calculated more appropriately.

The navigation apparatus 10 determines whether the driving of the user's vehicle is to be complete each time the overwrite of data in the blocks which overlap with the file to be refreshed is complete during the refresh (S535). When the driving of the user's vehicle is to be complete (S540), the refresh is interrupted. When the driving of the user's vehicle is to be complete, the refresh can be interrupted without destroying the data stored in the blocks. This configuration of the embodiment can prevent the following situations: the refresh is executed after the end of the driving; and, the continued refresh thereby increases the power consumption of the in-vehicle system 1, which has entered the power save mode.

The navigation apparatus 10 considers that the driving of the user's vehicle is to be complete when the user's vehicle enters a parking lot (S625: Yes) and when an expected required time is less than 5 minutes until the user's vehicle arrives at a destination (S615: Yes). The appropriate determination is possible about whether the driving of the user's vehicle is complete.

The navigation apparatus 10 determines whether the normal execution of the refresh is possible at the start of the refresh and each time the overwrite of data in the blocks overlapping with the file to be refreshed during the refresh (S505, S545). When vibration of the user's vehicle is strong during the travel of the user's vehicle, the contact between the memory card 30 and memory card reader/writer 20 may be poor. Then, for example, the write of the data into the memory card 30 becomes impossible, so that data to be refreshed may be destroyed. In such a case, it is necessary to determine that the normal execution of the refresh is impossible. The navigation apparatus 10 interrupts the refresh when the normal execution of the refresh is impossible (S550: No). The data stored in the memory card 30 can be prevented from being destroyed due to the abnormal normal execution of the refresh, so that the refresh can be executed more safely.

When the user's vehicle travels at 120 km/h or more (S705: Yes), the navigation apparatus 10 determines that the normal execution of the refresh is impossible (S725) because the vibration of the user's vehicle may become strong. When the user's vehicle is traveling on a road not used in the route guidance (S715: Yes), it is likely that the user's vehicle is traveling on a rough road, and the vibration of the user's vehicle may be thus strong, so that the navigation apparatus 10 determines that the normal execution of the refresh is impossible (S725). Accordingly, it is possible to accurately determine whether the normal execution of the refresh is possible.

The memory card reader/writer 20 includes the lid 23 covering the slot 22. When data is updated in the memory card 30, the closed lid 23 is locked by the locking mechanism 25. Therefore, the removal of the memory card 30 during the update of data and the failure of the update of data can be prevented.

The recess 21 of the memory card reader/writer 20 appears when the steering wheel moving system moves the steering wheel at the end of the driving. Therefore, during the driving of the user's vehicle, the memory card 30 is not extracted from the slot 22. Therefore, while the memory card reader/writer 20 executes the update etc. of data in the memory card 30, the connection between the memory card reader/writer 20 and the memory card 30 is not disconnected, and the update of data is not failed.

Second Embodiment

In the in-vehicle system 1 of a second embodiment, it is determined whether the refresh start condition provided to the file stored in the memory card 30 in accordance with the risk of occurrence of the read disturb problem is satisfied. The in-vehicle system 1 of the second embodiment is explained below.

In the second embodiment, when operation of the purport that the user's vehicle mounting the in-vehicle system 1 receives the operation for terminating the driving, the power supply to the in-vehicle system 1 stops, and all the functions of the in-vehicle system 1 stop.

Arrangement

The arrangement of the memory card reader/writer 20 constituting the in-vehicle system 1 of the second embodiment is explained.

Figure 13:
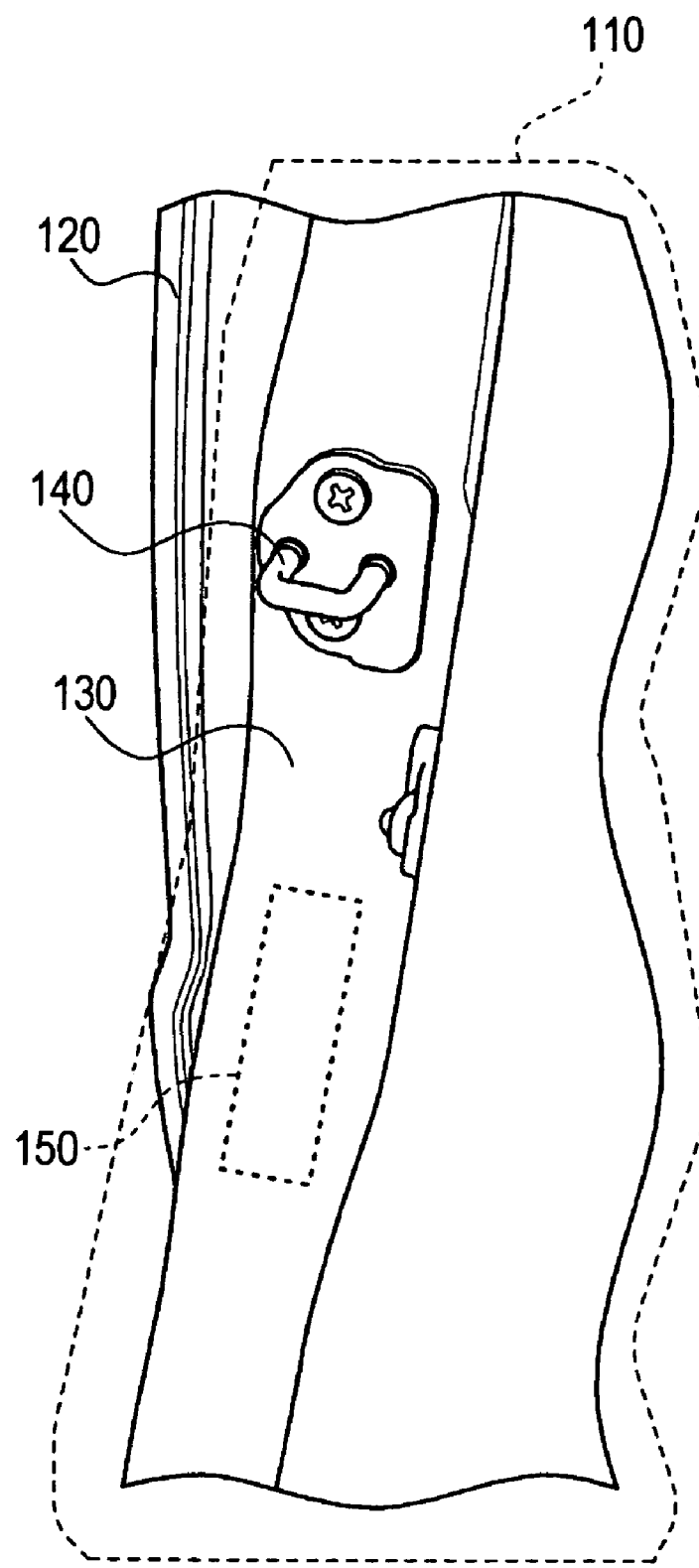
FIG. 13 is a front view of a contact surface of a body of the user's vehicle with a driver's seat door.

FIG. 13 shows a front view of part of a center pillar 110 on the side of the driver's seat, viewed from near the steering wheel of the user's vehicle. FIG. 13 also shows part of a rear door 120 on the left side relative to the center pillar 110. The rear door 120, which is a door for a rear seat right behind the driver's seat, is provided to the center pillar 110. A door lock striker 140 is provided to a contact surface 130 between the center pillar 110 and the driver's seat door. An arrangement area 150 is provided to the lower portion of the contact surface 130 of the lower part of the door lock striker 140. The recess 21 of the memory card reader/writer 20 of FIG. 2A is disposed to the arrangement area 150.

Explanation of Operation

Next, operation of the in-vehicle system 1 of the second embodiment is explained. In the in-vehicle system 1 of the first embodiment, the risk of occurrence of the data retention problem is calculated in accordance with the period elapsed after a file is written into the memory card 30. On the other hand, in the in-vehicle system 1 of the second embodiment, the risk of occurrence of the read disturb problem is calculated in accordance with the number of reads of a file after the file is written into the memory card 30.

Many parts of the processing executed by the in-vehicle system 1 of the second embodiment are the same as the processing executed by the in-vehicle system 1 of the first embodiment. Only the differences between the processing executed by the in-vehicle system 1 of the first embodiment and the processing executed by the in-vehicle system 1 of the second embodiment are explained below.

(1) Rewrite Management Table

The rewrite management table stored in the storage section 14 of the navigation apparatus 10 constituting the in-vehicle system 1 of the second embodiment is explained first.

The table of FIG. 14 shows the rewrite management table. The records constituting the rewrite management table correspond to files stored in the memory card 30 connected to the memory card reader/writer 20. The rewrite management table includes "ID," "file name," "number of updates," "number of reads," "risk," "address," and "file size."

The "ID" shows a number for identifying each record constituting the rewrite management table. The "file name" shows a name of a file corresponding to each record.

The "number of updates" shows the cumulative number of updates of data in a block which overlaps with the area storing a file corresponding to each record and in which data is updated most frequently.

The "number of reads" shows the number of reads of a file corresponding to each record. The "risk" shows a risk of occurrence of the read disturb problem in a file corresponding to each record. The five levels of Lv0 to Lv4 exist in the risk of occurrence of the read disturb problem. When a new file is written into the memory card 30, the risk of this file is set to Lv0 and the risk level rises as the number of reads of the file increases. The "risk" includes four items of "Lv1," "Lv2," "Lv3," and "Lv4," and each item corresponds to the risk level shown by the item name. A date or a null value is set to each item.

The date set in each item shows a date in which the risk has been set to the level shown by the item name. The null value shows that the risk does not reach the level shown by the item name. When the null value is set in all of "Lv1" to "Lv4," the risk of this file is set to Lv0.

The "address" shows a starting address of the area storing the file corresponding to the record in the flash memory constituting the memory card 30. The "file size" shows a size of a file corresponding to each record.

The control section 16 constituting the navigation apparatus 10 of the second embodiment reads a file stored in the memory card 30 and stores the file in the RAM of the control section 16 in accordance with the rewrite management table, and executes the refresh for writing the stored file into the same area again.

(2) Refresh Start Condition Table

The almost same refresh start condition table as the first embodiment is stored in the storage section 14 of the navigation apparatus 10 constituting the in-vehicle system 1 of the second embodiment. The refresh start condition table includes items "ID" and "refresh start condition" like in the first embodiment. The item "refresh start condition" has items "Lv1," "Lv2," and "Lv3." However, each item of the "refresh start condition" shows different meaning from that of the first embodiment.

In the first embodiment, the items "Lv1," "Lv2," and "Lv3" of the "refresh start condition" correspond to the levels of the risk of occurrence of the data retention problem. In the second embodiment, the items "Lv1," "Lv2," and "Lv3" of the "refresh start condition" correspond to the levels of the risk of occurrence of the read disturb problem.

(3) Setting Window of the Refresh Start Condition

Also in the in-vehicle system 1 of the second embodiment, when the user sets the refresh start condition, the setting window 200 of FIG. 6 is displayed on the display section 12 of the navigation apparatus 10.

(4) Rewrite

In the in-vehicle system 1 of the second embodiment, during the drive of the user's vehicle, almost the same rewrite as the in-vehicle system 1 of the first embodiment is periodically executed. The difference between the rewrite of the first embodiment and the rewrite of the second embodiment is explained.

In the rewrite of the first embodiment, the control section 16 of the navigation apparatus 10 of the in-vehicle system 1 executes the risk calculation, which is the subroutine, in S305. The risk calculation calculates the risk of occurrence of the data retention problem in a file stored in the memory card 30 connected to the memory card reader/writer 20. The control section 16 shifts the processing to S310 after the risk calculation.

In the rewrite of the second embodiment, the control section 16 of the navigation apparatus 10 of the in-vehicle system 1 executes the risk calculation, which is the subroutine, in S305. The risk calculation calculates the risk of occurrence of the read disturb problem in a file stored in the memory card 30 connected to the memory card reader/writer 20. The control section 16 shifts the processing to S310 after the risk calculation.

(5) Risk Calculation

Figure 15:
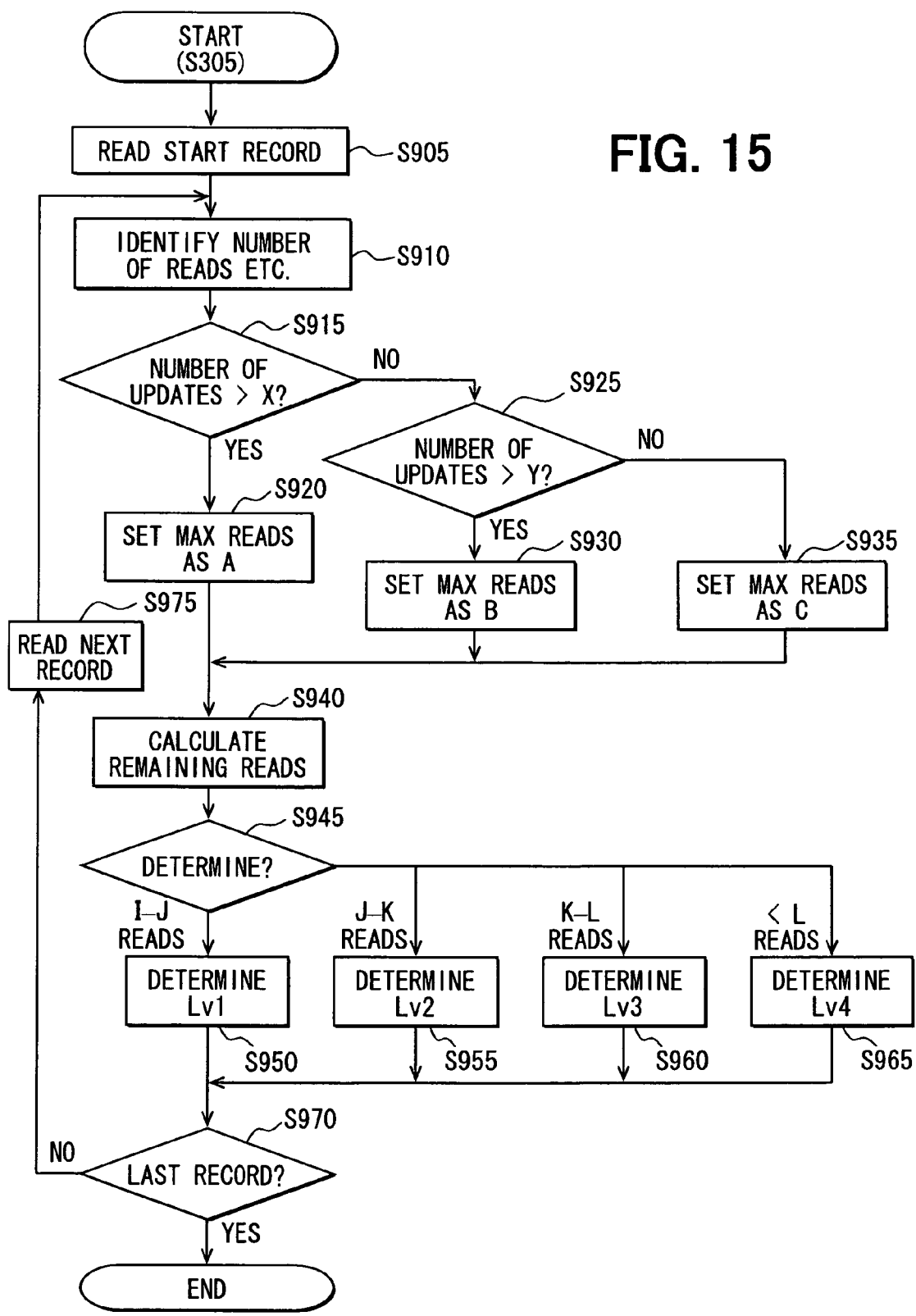
FIG. 15 is a flowchart of a risk calculation.

The risk calculation, which is a subroutine called from S305 in the rewrite of the second embodiment, is explained using a flowchart of FIG. 15.

In S905, the control section 16 of the navigation apparatus 10 of the in-vehicle system 1 reads a starting record of the rewrite management table stored in the storage section 14, stores the starting record temporarily in the RAM of the control section 16, and shifts the processing to S910.

In S910, the control section 16 identifies the "number of updates" and "number of reads" of the record stored temporarily in the RAM with reference to the record. The control section 16 identifies the level of the risk of occurrence of the read disturb problem in the file corresponding to the read record with reference to the "risk" of the record, and shifts the processing to S915.

In S915, the control section 16 determines whether the "number of updates" identified in S910 is more than X times. The control section 16 shifts the processing to S920 when the "number of updates" is more than X times. When the "number of updates" is below X times, the control section 16 shifts the processing to S925.

In S920, the control section 16 sets A times as the maximum number of reads, and shifts the processing to S940. The maximum number of reads shows the maximum number of the reads of a file corresponding to each record temporarily stored in the RAM without destroying data of memory cells constituting the area temporarily storing the file and data of memory cells connected to the cells constituting the area by the same lead.

In S925, the control section 16 determines whether the "number of updates" identified in S910 is more than Y times. The control section 16 shifts the processing to S930 when the "number of updates" is more than Y times. When "number of updates" is Y times or less, the control section 16 shifts the processing to S935.

In S930, the control section 16 sets B times as the maximum number of reads, and shifts the processing to S940. In S935, the control section 16 sets C times as the maximum number of reads, and shifts the processing to S940.

In S940, in accordance with the "number of reads" identified in S910, and with the maximum number of reads set in S920, S930, and S935, the control section 16 identifies the number of the remaining reads, and shifts the processing to S945. The number of remaining reads is the number by which a file corresponding to each record can be read at the present time without destroying data of memory cells constituting an area temporarily storing the file in the RAM and data of memory cells connected to the cells constituting the area by the same lead.

In S945, the control section 16 determines the number of remaining reads calculated in S940. When the number of remaining reads is less than I times and equal to J times or more, the control section 16 shifts the processing to S950. When the number of remaining reads is less than J times and equal to K times or more, the control section 16 shifts the processing to S955. When the number of remaining reads is less than K times and equal to L times or more, the control section 16 shifts the processing to S960. When the number of remaining reads is less than L times, the control section 16 shifts the processing to S965.

In S950, the control section 16 determines that the risk of occurrence of the read disturb problem is Lv1. When the level of the risk of occurrence of the read disturb problem in the file corresponding to the record, the level being identified in S910, is less than Lv1, the control section 16 identifies the current date by use of the calendar function. Then, the control section 16 sets the current date in "Lv1" of the "risk" of the same record in the rewrite management table stored in the storage section 14, and shifts the processing to S970.

In S955, the control section 16 determines that the risk of occurrence of the read disturb problem is Lv2. When the level of the risk of occurrence of the read disturb problem in the file corresponding to the record, the level being identified in S910, is less than Lv2, the control section 16 identifies the current date by use of the calendar function. Then, the control section 16 sets the current date in "Lv2" of the "risk" of the same record in the rewrite management table stored in the storage section 14, and shifts the processing to S970.

In S960, the control section 16 determines that the risk of occurrence of the read disturb problem is Lv3. When the level of the risk of occurrence of the read disturb problem in the file corresponding to the record, the level being identified in S910, is less than Lv3, the control section 16 identifies the current date by use of the calendar function. Then, the control section 16 sets the current date in "Lv3" of the "risk" of the same record in the rewrite management table stored in the storage section 14, and shifts the processing to S970.

In S965, the control section 16 determines that the risk of occurrence of the read disturb problem is Lv4. When the level of the risk of occurrence of the read disturb problem in the file corresponding to the record, the level being identified in S910, is less than Lv4, the control section 16 identifies the current date by use of the calendar function. Then, the control section 16 sets the current date in "Lv4" of the "risk" of the same record in the rewrite management table stored in the storage section 14, and shifts the processing to S970.

In S970, the control section 16 determines whether the record stored temporarily in the RAM is the last record of the rewrite management table. When the record is the last record, the control section 16 terminates the risk calculation. When the record is not the last record, the control section 16 shifts the processing to S975.

In S975, the control section 16 reads the record next to the record stored temporarily in the RAM from the storage section 14, stores the next record temporarily in the RAM, and shifts the processing to S910. The relationship between X and Y, which are predetermined constants showing the number of updates used in S915 and S925 is X>Y The relationship between A, B, and C, which are predetermined constants showing the maximum number of reads used in S920, S930, and S935 is C>B>A. The relationship between I, J, K, and L, which are predetermined constant showing the number of remaining reads used in S945 is I>J>K>L.

(6) Refresh

The same refresh as the first embodiment is called from S355 of the rewrite of the second embodiment. The refresh executed in the second embodiment is not explained.

(7) Drive Termination Determination

The same drive termination determination as the second embodiment is called from S535 of the refresh of the second embodiment. The drive termination determination executed in the second embodiment is not explained.

(8) Normal Execution Determination

The same normal execution determination as the first embodiment is called from S505 and S545 of the refresh of the second embodiment. The normal execution determination executed in the second embodiment is not explained.

(9) Condition Setting

Also in the second embodiment, when the control section 16 of the navigation apparatus 10 of the in-vehicle system 1 receives a predetermined operation via the operation section 11, the same condition setting as the first embodiment is executed. Therefore, the condition setting executed in the second embodiment is not explained.

Advantage

According to the in-vehicle system 1 of the second embodiment, the navigation apparatus 10 executes a refresh of a file corresponding to the refresh start condition when the refresh start condition is satisfied (S340: Yes, S350: Yes). Therefore, data of the block into which data is being written is prevented from being destroyed in the middle of the refresh when the driving of the user's vehicle is complete.

The navigation apparatus 10 does not refresh the file whose risk of occurrence of the read disturb problem is Lv0 (S315: Yes). Only when it is likely that the read disturb problem occurs, the refresh can be executed. Unnecessary increase of processing load of a control means can be avoided. Flash memories have the limited number of writes of data. Data cannot be stored in the area where the number of writes reaches the limited number. Therefore, the refresh is executed only when the risk is Lv1 or more, so that the increase of the number of writes of data can be suppressed, and the life of the flash memory can be thus prolonged.

The refresh start condition based on the risk of occurrence of the read disturb problem can be set in the navigation apparatus 10. Therefore, as the refresh start condition corresponding to the case where the risk of occurrence of the data retention problem is high, the condition can be set to be easier satisfied compared with the case where the risk of occurrence of the data retention problem is low. When the risk of occurrence of the read disturb problem is high, the refresh can be started more immediately compared with the case where the risk is low.

The navigation apparatus 10 calculates the risk of occurrence of the read disturb problem in accordance with the number of reads of a file. Therefore, the risk of occurrence of the read disturb problem is appropriately computable.

The navigation apparatus 10 calculates the risk of occurrence of the read disturb problem in consideration of the number of the updates of a block which overlaps with the area storing the file and in which data is most frequently updated (S415, S425). Therefore, the risk of occurrence of the read disturb problem can be calculated more appropriately.

The navigation apparatus 10 determines, during the refresh, whether the driving of the user's vehicle is to be complete each time the overwrite of data into the block which overlaps with the file corresponding to the refresh is complete (S535). The refresh is interrupted when the driving of the user's vehicle is to be complete (S540). When the driving of the user's vehicle is to be complete, the refresh can be interrupted without destroying the data stored in the block. This can reduce the possibility that a file to be refreshed is destroyed due to the termination of the electric power supply to the in-vehicle system 1 after the driving during the refresh.

Since the recess 21 of the memory card reader/writer 20 is disposed to the contact surface between the body of the user's vehicle and the driver's seat door, the memory card 30 is not extracted from the slot 22 during the driving of the user's vehicle. Therefore, when the memory card reader/writer 20 executes, e.g., an update of data of the memory card 30, the failure of the update of data due to the disconnection between the memory card reader/writer 20 and the memory card 30 can be prevented.

Another Embodiment (1) The refresh start condition may be set in each block or each group of blocks. The risk of occurrence of the data retention problem and or read disturb problem is calculated in each block or each group of blocks. It is determined whether the refresh start condition based on the risk is satisfied. When the refresh start condition based on the risk is satisfied, the corresponding block or corresponding group of blocks may be refreshed. In such a structure, the same advantage as the in-vehicle system 1 of the first embodiment and second embodiment can be acquired.

(2) In the in-vehicle system 1 of the first embodiment and second embodiment, in the refresh, a file to be refreshed is overwritten in the area storing the file. The read data may be written in an unused space.

Even in such a structure, the same advantage as the in-vehicle system 1 of the first embodiment and second embodiment can be acquired. In the refresh, the read data is written in an area of blocks having the less number of updates of data, so that the life of the flash memory can be lengthened.

Figure 16:
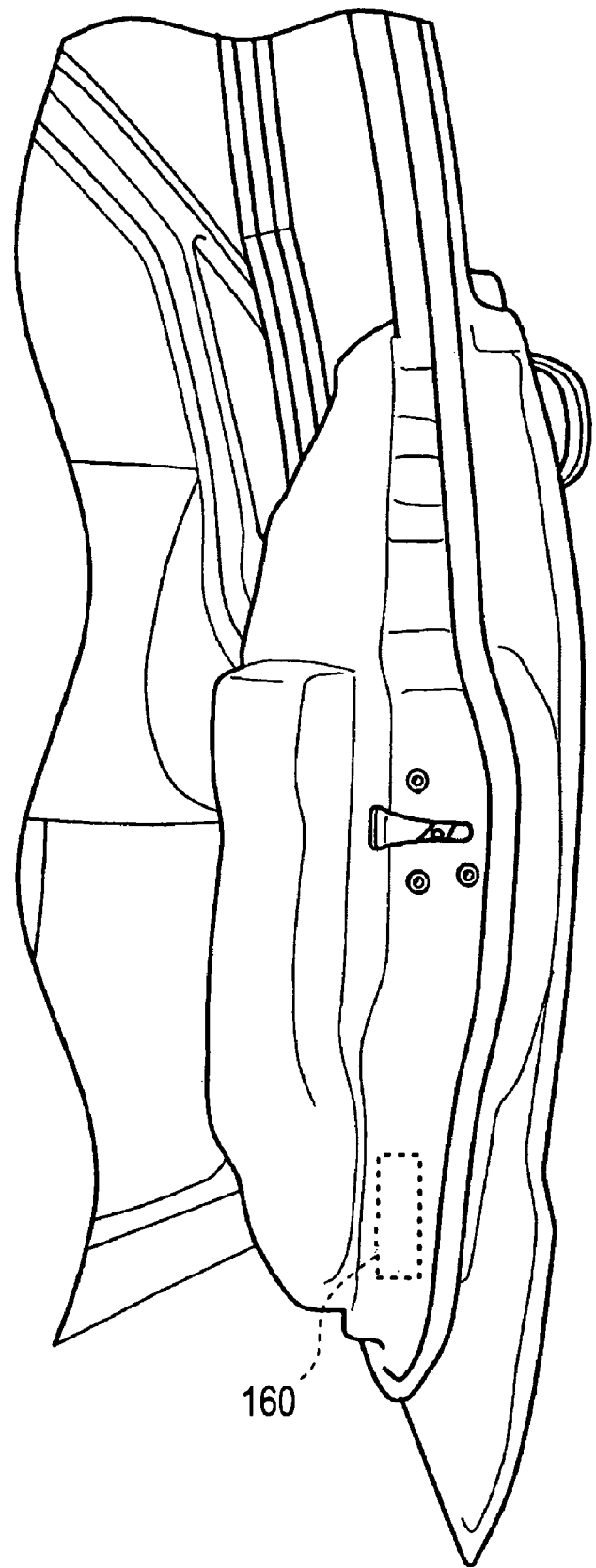
FIG. 16 is a front view of a contact surface of the driver's seat door of the user's vehicle with the body.

(3) FIG. 16 is a front view of the opened driver's seat door of the user's vehicle mounting the in-vehicle system 1, the door being viewed from the back. The recess 21 of the memory card reader/writer 20 of FIG. 2A may be disposed to the arrangement area 160 on the contact surface between the driver's seat door and the center pillar. Even in such a structure, during the driving of the user's vehicle, the memory card 30 is not extracted from the slot 22. Therefore, when the memory card reader/writer 20 executes, e.g., an update of data in the memory card 30, the failure of the update of data due to the disconnection between the memory card reader/writer 20 and the memory card 30 can be prevented.

Functions

The operation section 11 functions as an example of a receiving means or device. The storage section 14 functions as an example of a storage means or device. The control section 16 functions as an example of a control means or device. The in-vehicle LAN communication section 19 functions as an example of a vehicle speed acquisition means or device. The memory card 30 functions as an example of a storage medium. The lid 23 functions as an example of a shield means or device. The locking mechanism 25 functions as an example of a locking means or device.

The area storing the files corresponding to the records constituting the rewrite processing management table functions as an example of a predetermined area. S335 and S340, and S345 and S350, of the rewrite functions as an example of start condition determinations.

The storage section 14 and the control section 16 function as an example of a cumulative number identifying means or device. The position detector 17 functions as an example of a first current position identifying means or device and a second current position identifying means or device. The communication section 15 and the memory card reader/writer 20 function as an example of a map data acquisition means or device.

The communication section 15, the control section 16, the memory card reader/writer 20, the memory card 30, and the map data stored in the memory card 30 function as an example of a route identifying means or device and a destination identifying means or device.

The communication section 15, the control section 16, the position detector 17, the memory card reader/writer 20, the memory card 30, and the map data stored in the memory card 30 function as an example of a road type identifying means or device and a traffic information identifying means or device.

The communication section 15, the control section 16, the memory card reader/writer 20, the memory card 30, the map data stored in the memory card 30, and the external communication device 18 function as an example of a traffic congestion section identifying means or device.

The block of the NAND flash memory constituting the memory card 30 functions as an example of a write unit. The condition determined by the control section 16 in S335 and S340 of the rewrite functions as an example of a first condition. The condition determined by the control section 16 in S345 and S350 functions as an example of a second condition.

Each or any combination of processes, steps, or means explained in the above can be achieved as a software portion or device (e.g., subroutine) and/or a hardware portion or device (e.g., circuit or integrated circuit), including or not including a function of a related device; furthermore, the hardware portion or device can be constructed inside of a microcomputer.

Furthermore, the software portion or device or any combinations of multiple software portions or devices can be included in a software program, which can be contained in a computer-readable storage media or can be downloaded and installed in a computer via a communications network.

Aspects of the disclosure described herein are set out in the following clauses.

As an aspect of the disclosure, a rewrite apparatus is provided as follows. The apparatus is for reading data stored in a storage medium and writing data into the storage medium, and for executing a refresh which reads data stored in a predetermined area of the storage medium and rewrites the read data in the predetermined area. The rewrite apparatus includes a storage device and a control device. The storage device is configured to store a refresh start condition under which the refresh is started in the predetermined area of the storage medium. The control device is configured to execute a start condition determination for determining whether the refresh start condition stored in the storage medium is satisfied, and for executing, when it is determined that the refresh start condition is satisfied, the refresh in the predetermined area corresponding to the satisfied refresh start condition. Herein, the refresh start condition stored in the storage device is satisfied when a possibility to execute the refresh completely is high.

The predetermined area may be a minimum unit at the time of a write of data into a flash memory, may be a block which is a minimum unit at the time of an overwrite of data, and may be a set thereof. A file stored in the storage medium may be considered as the predetermined area. When overwriting data into the flash memory, data needs to be written after deleting data of the area to be overwritten. Therefore, the block whose data can be deleted independently is the minimum unit at the time of the overwrite of data.

The refresh is interrupted when the electric power supply to the rewrite apparatus is stopped during the refresh. There is the possibility that the data of the predetermined area corresponding to the refresh may be destroyed. In the start condition determination, the control device determines whether the refresh start condition is satisfied in order to determine how much possibility there is that the refresh can be completely executed. When the refresh start condition is satisfied, the control device considers that the possibility that the refresh can be completely executed is high, and starts the refresh. Therefore, the possibility that the refresh is interrupted due to, e.g., the stop of the electric power supply to the rewrite apparatus can be reduced.

However, the risk of occurrence of the data retention problem differs in accordance with a time elapsed after a write of data into the predetermined area. The risk of occurrence of the read disturb problem differs in accordance with the number of reads of data from the predetermined area.

In the rewrite apparatus, the control device may execute a risk calculation for calculating a risk of destruction of data stored in the predetermined area, and execute the start condition determination in the predetermined area corresponding to the risk calculation only when the risk is a predetermined value or over.

Accordingly, the refresh is executed only when the possibility that the data retention problem and the read disturb problem occur is high, and the unnecessary increase of processing load of the control device can be thus avoided. The number of writes of data is limited in flash memories. Data cannot be written in the area in which the number of writes reaches the limitation. As mentioned above, the refresh is executed only when the risk of occurrence of the data retention problem etc. is high, so that the increase of the number of writes of data can be suppressed, prolonging the life of the flash memory.

When the risk of occurrence of the data retention problem and the read disturb problem are high, the refresh may be started soon. Even when the possibility that the refresh can be executed completely is a little low, the refresh needs to be executed.

In the rewrite apparatus, the storage device may store a plurality of the refresh start conditions based on the risk of destruction of data stored in the predetermined area, and the control device may execute a risk calculation for calculating the risk to determine whether the refresh start condition based on the risk calculated in the risk calculation is satisfied in the start condition determination in the predetermined area corresponding to the risk calculation.

Accordingly, as the refresh start condition corresponding to the case where the risk of occurrence of the data retention problem and the read disturb problem is high, the condition easily satisfied in comparison with the case where the risk of occurrence of these problems is low can be set. Therefore, when the risk of occurrence of the data retention problem and the read disturb problem is high, the refresh can be started immediately.

The case where the priority to start the refresh differs in accordance with the importance of the data stored in the predetermined area can be assumed. When a file is considered to be a predetermined area, a time required for the refresh differs in accordance with a size of the file. The refresh start condition based on a size of a file may be set.

In the rewrite apparatus, the storage medium may include a plurality of the predetermined areas, the storage device may store a plurality of the refresh start conditions corresponding to the predetermined areas, and the control device may determine, in the start condition determination, whether the refresh start condition for the predetermined area corresponding to the start condition determination is satisfied.

Accordingly, the suitable refresh start condition based on the importance of the data stored to the predetermined area and the size of the predetermined area can be set. It is expected that the optimum refresh start condition changes with various factors such as the size of the predetermined area and the importance of the data stored in the predetermined area.

The rewrite apparatus may further include a reception device for receiving a request of a user. The control device may set the refresh start condition stored in the storage device in accordance with a request of the user received via the reception device.

The convenience of the rewrite apparatus is improved. The risk of occurrence of the data retention problem changes with a time elapsed after data is written into the flash memory, as explained above.

In the rewrite apparatus, the control device may calculate, in the risk calculation, the risk in accordance with a time elapsed after data is written into the predetermined area.

Accordingly, the risk of occurrence of the data retention problem is appropriately computable.

As explained above, the risk of occurrence of the read disturb problem changes with the number of reads of data stored in the NAND flash memory.

Further, in the rewrite apparatus, the control device may calculate, in the risk calculation, the risk in accordance with the number of reads of data written into the predetermined area.

Accordingly, the risk of occurrence of the read disturb problem is appropriately computable. In accordance with the cumulative number of updates of data in a certain area in a flash memory, the risk of occurrence of the data retention problem and read disturb problem change in the area.

In the rewrite apparatus, an area storing data in the storage medium may include one or more storage units. The rewrite apparatus may further include a cumulative number identifying device for identifying the cumulative number of updates of data in at least one of the storage units overlapping with the predetermined area. In the risk calculation, the control device may identify the cumulative number of updates of data in the storage units contained in the predetermined area corresponding to the risk calculation via the cumulative number identifying device, and calculate the risk in consideration of the identified cumulative number of the updates of the data. The storage unit may be a minimum unit into which data is written and be a block which is a minimum unit into which data is overwritten, for example.

The control device may estimate the cumulative number of updates of data in a predetermined area in accordance with the cumulative number of updates of data in one of the storage units overlapping with the predetermined area, and may calculate the risk in consideration of the estimated cumulative number. The control device may calculate the risk in consideration of the cumulative number of updates of data in the storage unit overlapping with the predetermined area and having the most cumulative number of updates of data.

Accordingly, the risk of occurrence of the data retention problem and read disturb problem can be calculated more appropriately. The storage unit may be a set of the minimum units, blocks, etc. for the write of data. By identifying the cumulative number of updates in the storage unit, the cumulative number of the updates of the minimum units of a write of data and the blocks constituting the storage unit is predicted. In accordance with the predicted cumulative number of updates of data, the risk of occurrence of, e.g., the data retention problem can be calculated.

An operation using data stored in the storage medium formed of, e.g., a flash memory is executed also in an in-vehicle device. In a vehicle, in order to reduce the load of the battery after the drive, the supply of the electric power to the in-vehicle device is usually restricted, and in some in-vehicle devices, the supply of electric power stops after the drive. Also in the in-vehicle device which is supplied with electric power even after the drive, the power consumption needs to be reduced after the drive. It is undesirable that the refresh is executed after the drive.

The rewrite apparatus is mounted to a vehicle. Accordingly, in the in-vehicle device in which the electric power supply stops after the drive, the possibility that the refresh is interrupted at the end of the drive can be reduced. Also in the in-vehicle device to which electric power is supplied even after the drive, the situation where electric power needs to be supplied to continue the refresh even after the drive can be avoided.

Specifically, the refresh start condition may be as follows. The rewrite apparatus may further include: a route identifying device for identifying a route of the vehicle; and a road type identifying device for identifying a type of a road on which the vehicle is traveling. One of the refresh start conditions stored in the storage device is a first condition, which may be a condition about an expected time during which the vehicle travels on an expressway. The control device, in the start condition determination, may calculate the expected time during which the vehicle travels on the expressway in accordance with a route of the vehicle identified by the route identifying device when a type of the road on which the vehicle is traveling is the expressway, and may consider that the first condition is satisfied when the expected time during which the vehicle travels on the expressway is a predetermined time or over, and determine that the refresh start condition is satisfied.

Usually, it is not likely that the drive is stopped in the middle of the travel on the expressway. Therefore, when an expected time during which the vehicle travels on this expressway is long enough, the possibility that the refresh is interrupted by the end of the drive can be reduced by starting the refresh during the travel of the vehicle on the expressway.

In the rewrite apparatus, the first condition stored in the storage device may include a condition about a speed of the vehicle. The control device, in the start condition determination, may consider that the first condition is satisfied when the expected time during which the vehicle travels on the expressway is the predetermined time or over and the speed of the vehicle is a predetermined speed or over, and determine that the refresh start condition is satisfied.

Accordingly, in case of slowdown to stop the vehicle, the refresh is not started even when the vehicle is traveling on the expressway, for example. Therefore, it is possible to determine the possibility that the refresh is interrupted more accurately.

The rewrite apparatus may further include a route identifying device for identifying a route of the vehicle, a congestion section identifying device for identifying a congestion section, and a first current position identifying device for identifying a current position of the vehicle. One of the refresh start conditions stored in the storage device is a second condition, which may be a condition about an expected time during which the vehicle travels in a congestion section. The control device, in the start condition determination, may calculate the expected time during which the vehicle is traveling in the congestion section in accordance with a route of the vehicle identified by the route identifying device and with a congestion section identified by the route identified by the route identifying device when the current position of the vehicle identified by the first current position identifying device is in the congestion section identified by the congestion section identifying device. The control device may then consider that the second condition is satisfied when the expected time during which the vehicle travels in the congestion section is a predetermined time or over, and determine that the refresh start condition is satisfied.

Usually, it is not likely that the drive is stopped in the middle of the travel in the traffic congestion section. Therefore, the possibility that the refresh is interrupted can be reduced by starting the refresh while the vehicle travels in the traffic congestion section when the expected time during which the vehicle travels in this traffic congestion section is long enough.

In the rewrite apparatus, the second condition stored in the storage device may include a condition about a speed of the vehicle. The control device, in the start condition determination, may consider that the second condition is satisfied when the expected time during which the vehicle travels in the congestion section is a predetermined time or over and the speed of the vehicle is a predetermined speed or over, and determine that the refresh start condition is satisfied.

Accordingly, for example, in case of slowdown to stop the vehicle, the refresh is not started even when the vehicle travels in the traffic congestion section. Therefore, it is possible to determine the possibility that the refresh is interrupted more accurately.

Even when the refresh start condition is satisfied to start the refresh, the drive of the vehicle mounting the rewrite apparatus may be complete by the change of the situation. For example, data of a storage medium formed of a flash memory needs to be overwritten by the above block. When power supply is stopped during the overwrite of data, data of the block in which data is being overwritten may be destroyed.

In the rewrite apparatus, the area storing data in the storage medium may include a plurality of write units. The control device writes data in each of the write units when writing data into the storage medium, writes the data read from the write units constituting the predetermined area again into the same write units in the refresh, and further executes a drive termination determination for determining whether there is a situation where a drive of the vehicle is terminated during the refresh. The control device, in the drive termination determination, may interrupt the refresh under execution at the time of the termination of the write of data when determining that there is the situation where the drive is terminated and when the write of data into the write units is under execution, and interrupt the refresh under execution when the write of data into the write units is not being executed.

The write unit may be a block. When power supply is stopped during the overwrite of data into the block, the data of the block may be destroyed.

However, in such a structure, when the drive of the vehicle is complete, the refresh can be interrupted without destroying the data stored in the storage medium.

Specifically, the drive termination determination may be as follows.

The rewrite apparatus may further include a map data acquisition device for acquiring map data in which positions of facilities and information about the facilities can be identified, and a second current position identifying device for identifying a current position of the vehicle in a map shown by the map data acquired by the map data acquisition device. The control device, in the drive termination determination, may identify a current position of the vehicle via the second current position identifying device, identify information about facilities around the identified current position of the vehicle in accordance with the map data acquired by the map data acquisition device, and determine whether there is the situation where the drive of the vehicle is terminated in accordance with the information about the facilities around the identified current position of the vehicle.

Accordingly, for example, when the vehicle mounting the rewrite apparatus enters a facility such as a parking lot, the drive of the vehicle is determined to be complete, and the refresh can be stopped.

The rewrite apparatus may further include: a destination identifying device for identifying a destination of the vehicle; and a second current position identifying device for identifying a current position of the vehicle. The control device may determine, in the drive termination determination, whether there is a situation where the drive of the vehicle is terminated in accordance with a destination of the vehicle identified by the destination identifying device and a current position of the vehicle identified by the second current position identifying device.

Accordingly, for example, when a route guidance by the navigation apparatus is executed in the vehicle mounting the rewrite apparatus, the engine of the vehicle is determined to be stopped when the vehicle arrives at the destination of the route guidance, and the refresh can be stopped.

For example, when vibration of the vehicle is strong, the contact between the storage medium and the rewrite apparatus becomes poor, the refresh cannot be executed normally, and data stored in the storage medium may be thus destroyed.

In the rewrite apparatus, the area storing data in the storage medium may include a plurality of write units. The control device writes data into each of the write units when writing the data into the storage medium, and writes the data read from the write units constituting the predetermined area into the same write units in the refresh. The control device may execute a normal execution determination for determining whether a normal execution of the refresh is possible during the refresh. In the normal execution determination, the control device may interrupt the refresh under execution at the termination of the write of data when determining that the normal execution of the refresh is impossible and when the write of data into the write units is under execution, and interrupt the refresh under execution when the write of data into the write units is not under execution.

Accordingly, when the refresh cannot be normally executed, the refresh can be stopped without destroying data, and it is possible to execute the refresh more safely.

When the following conditions are satisfied, the refresh may be determined not to be executed normally. The rewrite apparatus may further include a vehicle speed acquisition device for acquiring a speed of the vehicle. In the normal execution determination, the control device may determine that the normal execution of the refresh is impossible when the speed of the vehicle acquired by the vehicle speed acquisition device is a predetermined value or over.

Vibration of the vehicle produced under, e.g., the influence of the bumps on a road surface becomes stronger as the speed rises, and thus there is a possibility of disturbing the normal execution of the refresh. Therefore, such a structure enables the refresh to be executed more safely.

The rewrite apparatus may further include a road information identifying device for identifying information about a road on which the vehicle is traveling. In the normal execution determination, in accordance with the information about the road on which the vehicle is traveling, the information being identified by the road information identifying device, the control device may determine whether the vehicle is traveling on a rough road, and determine that the normal execution of the refresh is impossible when the vehicle is traveling on the rough road.

The traffic information identifying device may identify information about the road on which the vehicle is traveling in accordance with a current position of the map data and the vehicle. Specifically, for example, the control device may determine that the vehicle is traveling on a rough road when the road on which the vehicle is traveling is the road not used in the route guidance of the navigation apparatus.

When traveling on the rough road, vibration of the vehicle becomes strong, and thus there is a possibility of disturbing the normal execution of the refresh. Therefore, such a structure enables the refresh to be executed more safely.

In case of disconnection between the rewrite apparatus and the storage medium during, e.g., the write of data into the storage medium, it is likely that the write of data into the storage medium is interrupted to destroy the data being written.

The rewrite apparatus may include a slot for loading the storage medium for writing and reading data, and further include a blocking device for blocking a removal of the storage medium loaded from the slot by covering the slot, and a locking device for locking the blocking device. The control device may lock the blocking device covering the slot by use of the locking device when writing data into the storage medium.

Accordingly, the disconnection between the rewrite apparatus and the storage medium during, e.g., the write of data into the storage medium due to the removal of the storage medium connected to the rewrite apparatus can be prevented.

The following structure may be used to avoid the disconnection between the rewrite apparatus and the storage medium during, e.g., the write of data into the storage medium. In the rewrite apparatus, a steering wheel position moving device for moving a steering wheel to a predetermined position at the start of the drive may be disposed to the vehicle. The rewrite apparatus may include a slot for loading the storage medium for writing and reading data. The slot may be disposed to a portion blocked by a movement of the steering wheel by the steering wheel moving device at the start of the drive of the vehicle.

Accordingly, the storage medium connected to the rewrite apparatus is not removed from the slot during the drive of the vehicle. Therefore, the disconnection between the rewrite apparatus and the storage medium can be prevented while the rewrite apparatus executes a write of data into the storage medium.

The rewrite apparatus may include a slot for loading the storage medium for writing and reading data. The slot may be disposed to a contact surface of a body of the vehicle with the door or to a contact surface of the door of the vehicle with the body.

Usually, it is likely that the door of the vehicle is closed during the travel of the vehicle and the door is closed during the drive of the vehicle. Therefore, the possibility that the disconnection between the rewrite apparatus and the storage medium due to the removal of the storage medium from the slot while the rewrite apparatus writes data into the storage medium can be reduced.

It will be obvious to those skilled in the art that various changes may be made in the above-described embodiments of the present invention. However, the scope of the present invention should be determined by the following claims.

What is claimed is:

1. A rewrite apparatus for reading data stored in a storage medium and writing data into the storage medium, and for executing a refresh which reads data stored in a predetermined area of the storage medium and rewrites the read data in the predetermined area, the rewrite apparatus comprising:
    a storage device configured to store a refresh start condition under which the refresh is started in the predetermined area of the storage device;
    a control device configured to execute a start condition determination for determining whether the refresh start condition stored in the storage device is satisfied, and for executing the refresh in the predetermined area when it is determined that the refresh start condition is satisfied;
    a route identifying device configured to identify a route of a vehicle; and
    a road type identifying device configured to identify a type of a road on which the vehicle is traveling,
wherein:
    the rewrite apparatus is mounted to the vehicle,
    the refresh start condition stored in the storage device is satisfied when a possibility to execute the refresh completely is at least a predetermined risk value,
    the refresh start condition stored in the storage device includes a first condition about an expected time during which the vehicle travels on an expressway; and
    when the type of the road on which the vehicle is traveling is the expressway, the control device is further configured, in the start condition determination,
        to calculate an expected time during which the vehicle travels on the expressway in accordance with the route of the vehicle identified by the route identifying device, and
        to consider that the first condition is satisfied when the expected time during which the vehicle travels on the expressway is a predetermined time or over to thereby determine that the refresh start condition is satisfied.

2. The rewrite apparatus according to claim 1,
wherein:
    the first condition stored in the storage device includes a condition about a speed of the vehicle; and
    the control device is further configured, in the start condition determination, to consider that the first condition is satisfied when the expected time during which the vehicle travels on the expressway is the predetermined time or over and the speed of the vehicle is a predetermined speed or over to thereby determine that the refresh start condition is satisfied.

3. A rewrite apparatus for reading data stored in a storage medium and writing data into the storage medium, and for executing a refresh which reads data stored in a predetermined area of the storage medium and rewrites the read data in the predetermined area, the rewrite apparatus comprising:
    a storage device configured to store a refresh start condition under which the refresh is started in the predetermined area of the storage device;
    a control device configured to execute a start condition determination for determining whether the refresh start condition stored in the storage device is satisfied, and for executing the refresh in the predetermined area when it is determined that the refresh start condition is satisfied;
    a route identifying device configured to identify a route of a vehicle;
    a congestion section identifying device configured to identify a congestion section; and
    a current position identifying device configured to identify a current position of the vehicle,
wherein:
    the rewrite apparatus is mounted to the vehicle,
    the refresh start condition stored in the storage device is satisfied when a possibility to execute the refresh completely is at least a predetermined risk value,
    the refresh start condition stored in the storage device includes a first condition, which is a condition about an expected time during which the vehicle travels in a congestion section; and
    the control device is further configured, in the start condition determination,
        to calculate the expected time during which the vehicle is traveling in the congestion section in accordance with the route of the vehicle identified by the route identifying device and with the congestion section identified by the congestion section identifying device when the current position of the vehicle identified by the current position identifying device exists in the congestion section identified by the congestion section identifying device, and to consider that the first condition is satisfied when the expected time during which the vehicle travels in the congestion section is a predetermined time or over to thereby determine that the refresh start condition is satisfied.

4. The rewrite apparatus according to claim 3, wherein:

the first condition stored in the storage device includes a condition about the speed of the vehicle; and the control device is further configured, in the start condition determination, to consider that the first condition is satisfied when the expected time during which the vehicle travels in the congestion section is a predetermined time or over and when the speed of the vehicle is a predetermined speed or over, to thereby determine that the refresh start condition is satisfied.

5. A rewrite apparatus for reading data stored in a storage medium and writing data into the storage medium, and for executing a refresh which reads data stored in a predetermined area of the storage medium and rewrites the read data in the predetermined area, the rewrite apparatus comprising:

a storage device configured to store a refresh start condition under which the refresh is started in the predetermined area of the storage device;

a control device configured to execute a start condition determination for determining whether the refresh start condition stored in the storage device is satisfied, and for executing the refresh in the predetermined area when it is determined that the refresh start condition is satisfied;

wherein:

the rewrite apparatus is mounted to a vehicle, the refresh start condition stored in the storage device is satisfied when a possibility to execute the refresh completely is at least a predetermined risk value, an area, which stores data in the storage medium, includes a plurality of write units; and the control device is further configured to write data in each of the write units when writing data into the storage medium, write data read from the write units constituting the predetermined area again in each of the same write units in the refresh, and execute a drive termination determination for determining whether there is a situation where a drive of the vehicle is terminated during the refresh;

the control device is yet further configured, when determining that there is the situation where the drive is terminated in the drive termination determination, to interrupt the refresh under execution at a time of a termination of a write of data when the write of data into the write units is under execution, and interrupt the refresh under execution when the write of data into the write units is not under execution.

6. The rewrite apparatus according to claim 5, wherein:

the control device is further configured to execute a risk calculation for calculating a risk, which is a degree of destruction of the data stored in the predetermined area; and only when the risk is equal to or greater than a predetermined value, the start condition determination is executed with respect to the predetermined area.

7. The rewrite apparatus according to claim 6, wherein the control device calculates, in the risk calculation, the risk in accordance with a time elapsed after data is written in the predetermined area.

8. The rewrite apparatus according to claim 7, wherein:

an area, which stores data in the storage medium, includes one or more storage units;

the rewrite apparatus further comprises a cumulative number identifying device configured to identify a cumulative number of updates of data in at least one of the storage units overlapping with the predetermined area; and the control device is further configured, in the risk calculation, to identify the cumulative number of updates of data in the storage units contained in the predetermined area via the cumulative number identifying device, and to calculate the risk in consideration of the identified cumulative number of updates of data.

9. The rewrite apparatus according to claim 6, wherein the control device calculates, in the risk calculation, the risk in accordance with a number of reads of data written in the predetermined area.

10. The rewrite apparatus according to claim 5, wherein:

the refresh start condition is stored in the storage device as one of a plurality of refresh start conditions individually corresponding to risks of destruction of the data stored in the predetermined area; and the control device is further configured to execute a risk calculation for calculating a risk to thereby determine whether the refresh start condition corresponding to the risk calculated in the risk calculation is satisfied in the start condition determination with respect to the predetermined area.

11. The rewrite apparatus according to claim 5, wherein:

the predetermined area is included in the storage medium as one of a plurality of predetermined areas;

the refresh start condition is included in the storage device as one of a plurality of refresh start conditions, the refresh start conditions individually corresponding to the predetermined areas; and the control device is further configured to determine, in the start condition determination, whether the refresh start condition with respect to the predetermined area is satisfied.

12. The rewrite apparatus according to claim 5, further comprising:

a reception device configured to receive a request of a user, and the control device is further configured to set the refresh start condition stored in the storage device in accordance with the request of the user received via the reception device.

13. The rewrite apparatus according to claim 5, further comprising:

a map data acquisition device configured to acquire map data in which positions of facilities and information about the facilities are identified; and a current position identifying device configured to identify a current position of the vehicle in a map shown by the map data acquired by the map data acquisition device, wherein:
the control device is further configured, in the drive termination determination, to
identify the current position of the vehicle via the current position identifying device,
identify information about facilities around the identified current position of the vehicle in accordance with the map data acquired by the map data acquisition device, and
determine whether there is the situation where the drive of the vehicle is terminated in accordance with the information about the facilities around the identified current position of the vehicle.

14. The rewrite apparatus according to claim 5, further comprising:
a destination identifying device configured to identify a destination of the vehicle; and
a current position identifying device configured to identify the current position of the vehicle,
wherein
the control device is further configured, to determine, in the drive termination determination, whether there is the situation where the drive of the vehicle is terminated in accordance with the destination of the vehicle identified by the destination identifying device and the current position of the vehicle identified by the current position identifying device.

15. The rewrite apparatus according to claim 5, further comprising:
a slot configured to load the storage medium for writing and reading data;
a blocking device configured to block a removal of the storage medium loaded from the slot by covering the slot; and
a locking device configured to lock the blocking device, wherein
the control device is further configured to lock the blocking device covering the slot by use of the locking device when writing data into the storage medium.

16. The rewrite apparatus according to claim 5, wherein:
a steering wheel position moving device is disposed in the vehicle to move a steering wheel to a predetermined position at a start of a drive;
the rewrite apparatus further comprises a slot configured to load the storage medium for writing and reading data; and
the slot is disposed on a portion blocked due to a movement of the steering wheel by the steering wheel moving device.

17. The rewrite apparatus according to claim 5, comprising:
a slot configured to load the storage medium for writing and reading data,
wherein
the slot is disposed on a contact surface of a door of a body of the vehicle or on a contact surface of the body at the door of the vehicle.

18. A rewrite apparatus for reading data stored in a storage medium and writing data into the storage medium, and for executing a refresh which reads data stored in a predetermined area of the storage medium and rewrites the read data in the predetermined area, the rewrite apparatus comprising:
a storage device configured to store a refresh start condition under which the refresh is started in the predetermined area of the storage device;
a control device configured to execute a start condition determination for determining whether the refresh start condition stored in the storage device is satisfied, and for executing the refresh in the predetermined area when it is determined that the refresh start condition is satisfied;
wherein:
the rewrite apparatus is mounted to a vehicle,
the refresh start condition stored in the storage device is satisfied when a possibility to execute the refresh completely is at least a predetermined risk value,
an area, which stores data in the storage medium, includes a plurality of write units;
the control device is further configured to
write data into each of the write units when writing the data into the storage medium,
write data read from the write units constituting the predetermined area in the refresh, and
execute a normal execution determination for determining whether a normal execution of the refresh is possible during the refresh; and
the control device is yet further configured, when determining that the normal execution of the refresh is impossible in the normal execution determination, to
interrupt the refresh under execution at a termination of the write of data when the write of data into the write units is under execution, and
interrupt the refresh under execution when the write of data into the write units is not under execution.

19. The rewrite apparatus according to claim 18, further comprising:
a vehicle speed acquisition device configured to acquire a speed of the vehicle,
wherein
the control device is further configured, in the normal execution determination, to determine that the normal execution of the refresh is impossible when the speed acquired by the vehicle speed acquisition device is a predetermined value or over.

20. The rewrite apparatus according to claim 18, further comprising:
a road information identifying device configured to identify information about a road on which the vehicle is traveling,
wherein
the control device is further configured, in the normal execution determination, to
determine whether the vehicle is traveling on a rough road, and
determine that the normal execution of the refresh is impossible when the vehicle traveling on the rough road in accordance with the information about the road on which the vehicle is traveling, the information being identified by the road information identifying device.

* * * * *